US008610082B2

(12) United States Patent
Sano et al.

(10) Patent No.: US 8,610,082 B2
(45) Date of Patent: Dec. 17, 2013

(54) DRAWING APPARATUS AND METHOD OF MANUFACTURING ARTICLE

(75) Inventors: Kentaro Sano, Utsunomiya (JP); Masato Muraki, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/423,960

(22) Filed: Mar. 19, 2012

(65) Prior Publication Data

US 2012/0241641 A1    Sep. 27, 2012

(30) Foreign Application Priority Data

Mar. 25, 2011  (JP) ................................. 2011-068014
May 31, 2011  (JP) ................................. 2011-122742

(51) Int. Cl.
*G21K 5/04*    (2006.01)

(52) U.S. Cl.
USPC ............... 250/396 R; 250/492.2; 250/492.22; 250/492.23; 250/492.3; 250/505.1

(58) Field of Classification Search
USPC .................. 250/396 R, 492.1, 492.2, 492.21, 250/492.22, 492.23, 492.3, 505.1
See application file for complete search history.

(56) References Cited

U.S. PATENT DOCUMENTS

| 8,258,472 | B2 * | 9/2012 | Shindo et al. ................. 250/306 |
| 8,258,488 | B2 * | 9/2012 | Platzgummer et al. ..... 250/492.1 |
| 2006/0169898 | A1 * | 8/2006 | Muraki et al. ................. 250/310 |
| 2006/0169927 | A1 * | 8/2006 | Muraki et al. ............ 250/492.23 |
| 2011/0073782 | A1 * | 3/2011 | Wieland .................... 250/492.22 |
| 2011/0079730 | A1 * | 4/2011 | Wieland .................... 250/396 R |
| 2012/0091358 | A1 * | 4/2012 | Wieland et al. ........... 250/396 R |

FOREIGN PATENT DOCUMENTS

JP    9-007538 A    1/1997

* cited by examiner

*Primary Examiner* — Michael Logie

(74) *Attorney, Agent, or Firm* — Canon U.S.A., Inc. IP Division

(57) ABSTRACT

A drawing apparatus performs drawing on a substrate with charged particle beams. The drawing apparatus includes an irradiation optical system including a collimator lens; an aperture array configured to split the charged particle beam into a plurality of charged particle beams; a converging lens array configured to form a plurality of crossovers of the plurality of charged particle beams; and a projection optical system including an element in which a plurality of apertures corresponding to the plurality of crossovers are formed, and a plurality of projection lenses corresponding to the apertures. The converging lens array includes converging lenses disposed such that each of the plurality of crossovers, which are formed by the converging lenses from the charged particle beam incident on the aperture array at incidence angles associated with aberration of the irradiation optical system, is aligned with corresponding one of the apertures in the element.

24 Claims, 19 Drawing Sheets

APERTURE ARRANGEMENT OF APERTURE ARRAY AND CONVERGING LENS ARRAY

BEAM ARRANGEMENT ON IMAGING PLANE

○ APERTURE ARRANGEMENT OF BLANKER ARRAY
● ACTUAL BEAM ARRANGEMENT

FIG.5A
APERTURE ARRANGEMENT OF APERTURE ARRAY AND CONVERGING LENS ARRAY
FIG.5B
BEAM ARRANGEMENT ON IMAGING PLANE
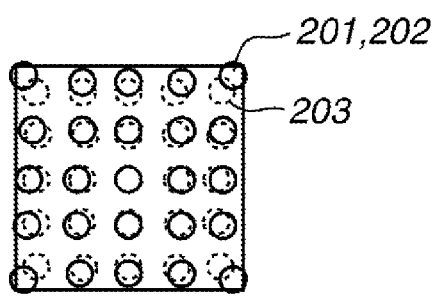
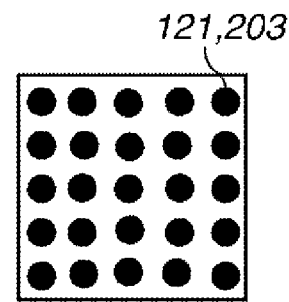
○ APERTURE ARRANGEMENT OF BLANKER ARRAY
○ APERTURE ARRANGEMENT OF APERTURE ARRAY AND CONVERGING LENS ARRAY

FIG.6A
APERTURE ARRANGEMENT OF APERTURE ARRAY AND CONVERGING LENS ARRAY WHEN DEFOCUS ADJUSTMENT IS NOT PERFORMED

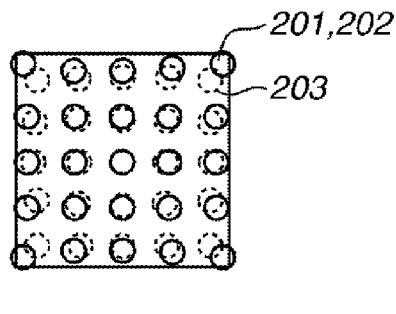

FIG.6B
APERTURE ARRANGEMENT OF APERTURE ARRAY AND CONVERGING LENS ARRAY WHEN DEFOCUS ADJUSTMENT IS PERFORMED

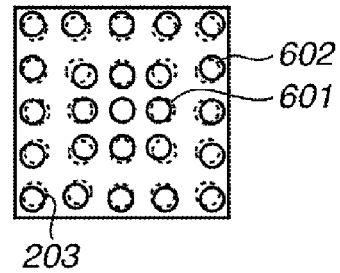

FIG.6C

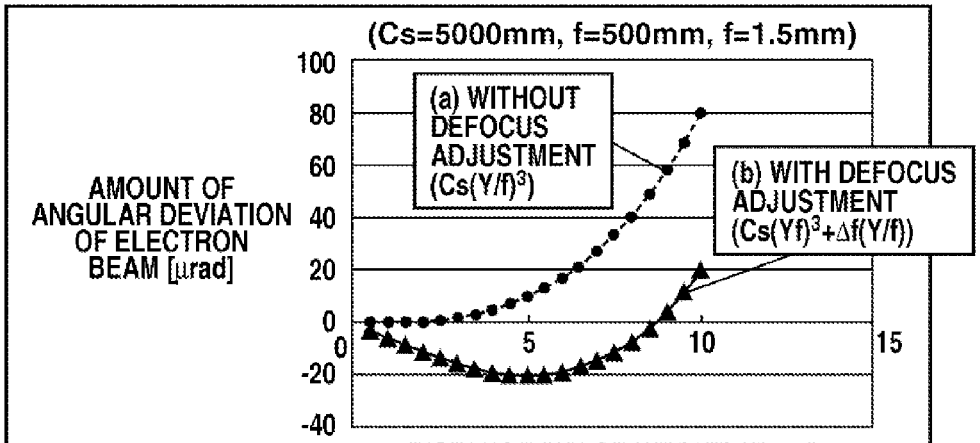

$Cs = Cs(CO\text{-}adj) + Cs(CL) + Cs(Coulomb)$ $Cs(CO\text{-}adj)$: SPHERICAL ABERRATION OF CROSSOVER ADJUSTMENT OPTICAL SYSTEM (POSITIVE)
$Cs(CL)$: SPHERICAL ABERRATION OF COLLIMATOR LENS (POSITIVE)
$Cs(Coulomb)$: SPHERICAL ABERRATION OF SPACE-CHARGE EFFECT (NEGATIVE)

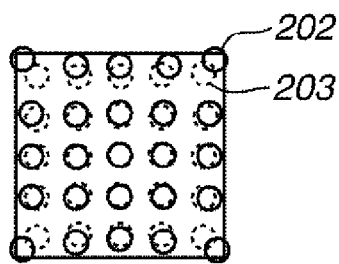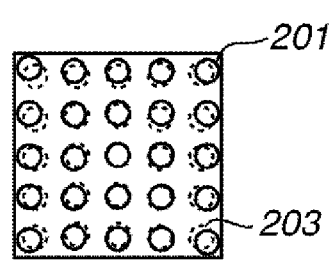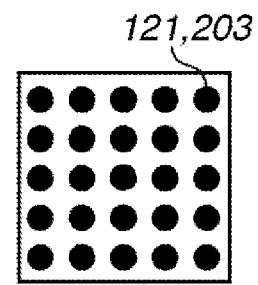
FIG.8A
APERTURE ARRANGEMENT OF CONVERGING LENS ARRAY
FIG.8B
APERTURE ARRANGEMENT OF APERTURE ARRAY
FIG.8C
BEAM ARRANGEMENT ON IMAGING PLANE

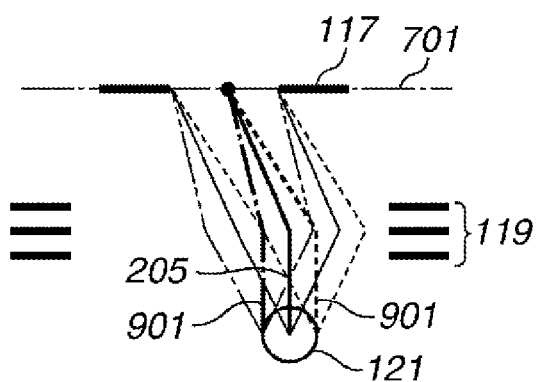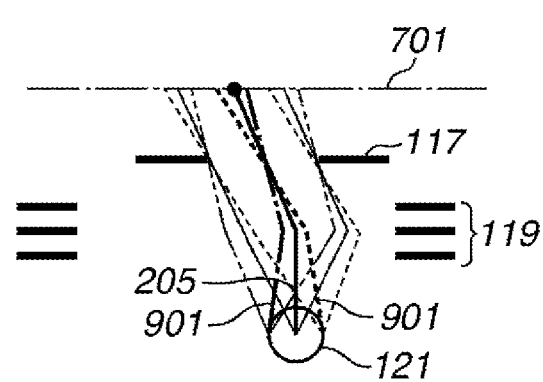

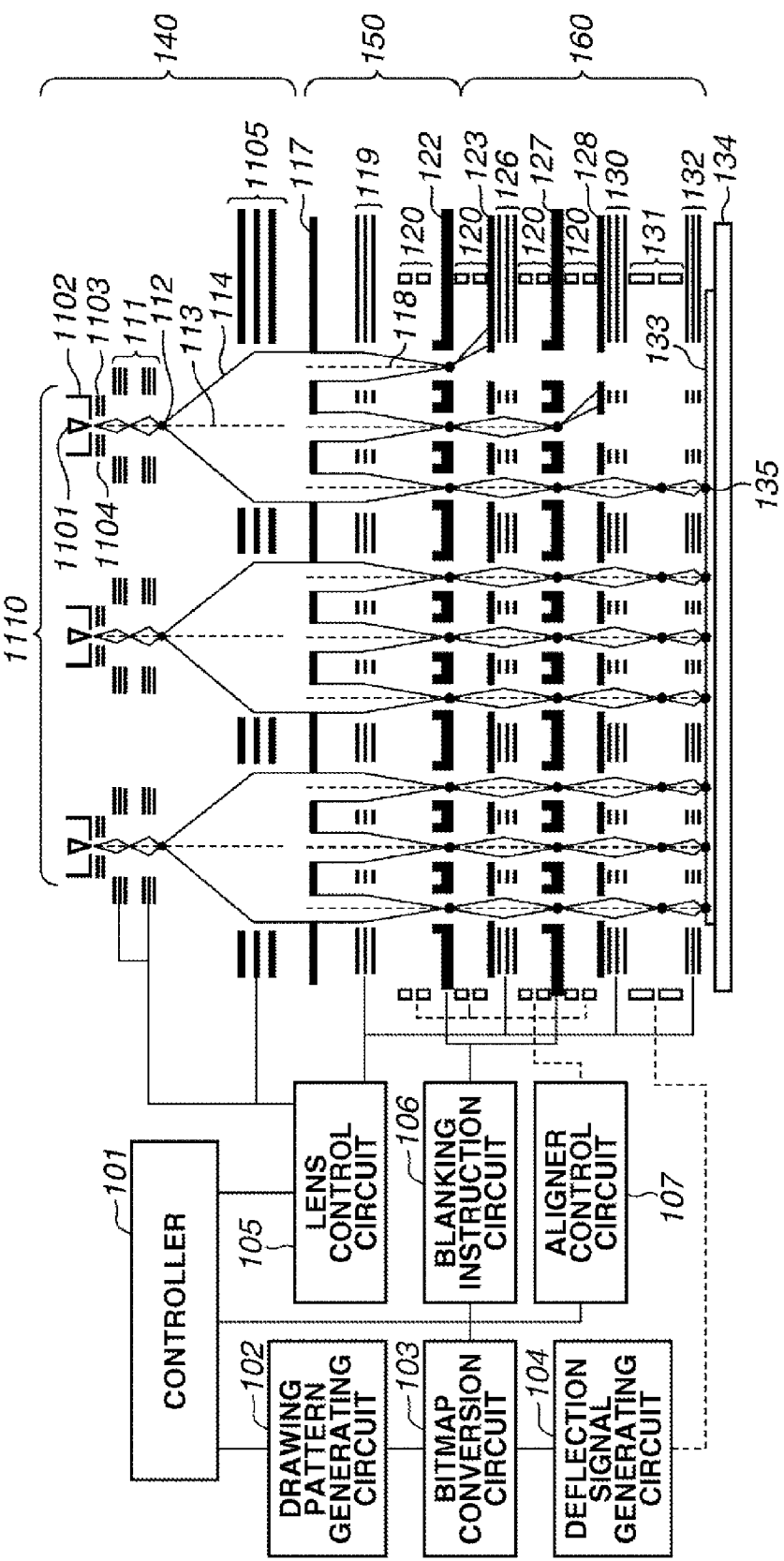

APERTURE ARRANGEMENT
OF APERTURE ARRAY AND
CONVERGING LENS ARRAY

BEAM ARRANGEMENT
ON IMAGING PLANE

APERTURE ARRANGEMENT
OF APERTURE ARRAY AND
CONVERGING LENS ARRAY

BEAM ARRANGEMENT
ON IMAGING PLANE
(STOP APERTURE ARRAY)

APERTURE ARRANGEMENT
OF APERTURE ARRAY AND
CONVERGING LENS ARRAY

BEAM ARRANGEMENT
ON IMAGING PLANE
(STOP APERTURE ARRAY)

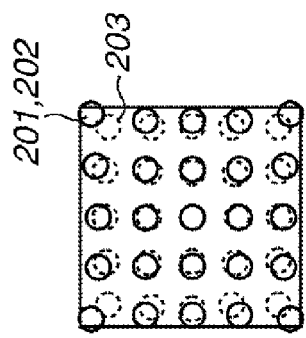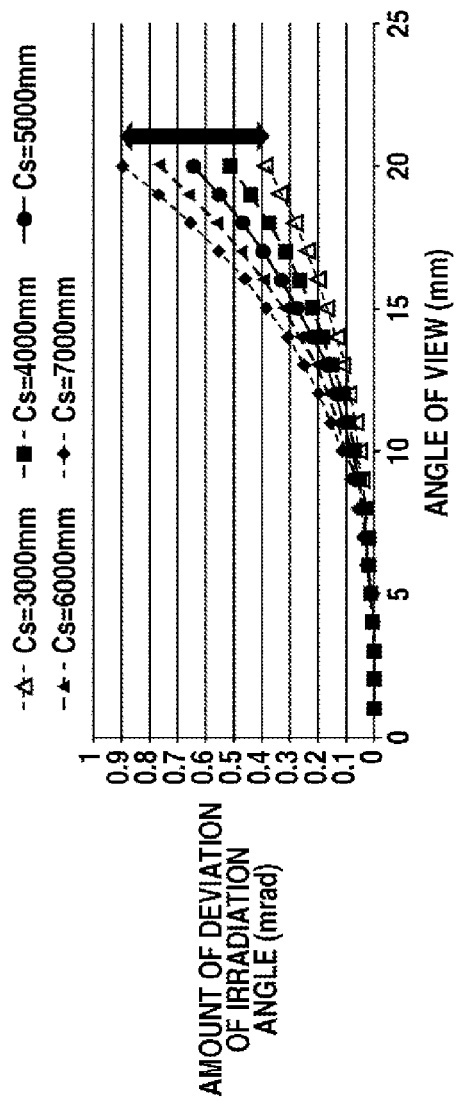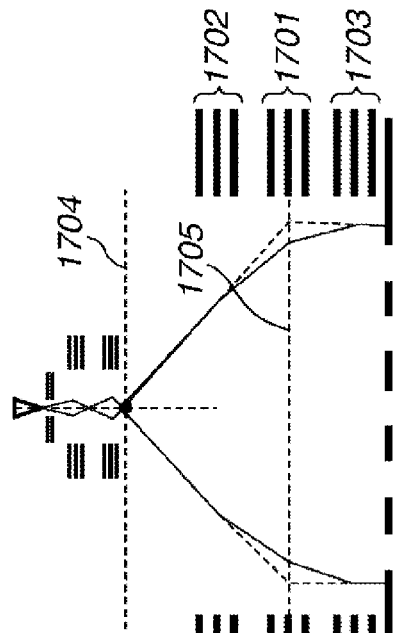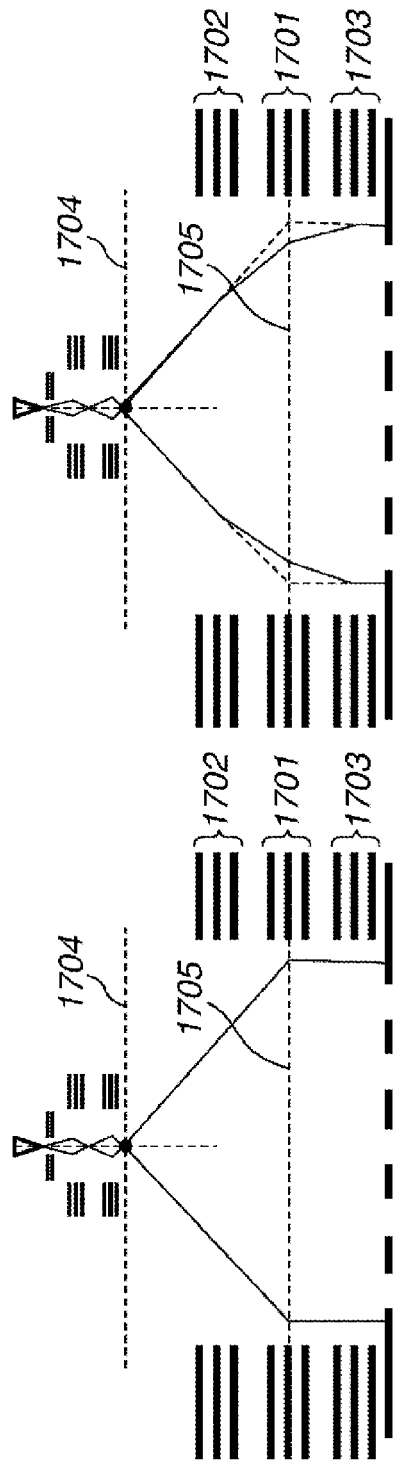

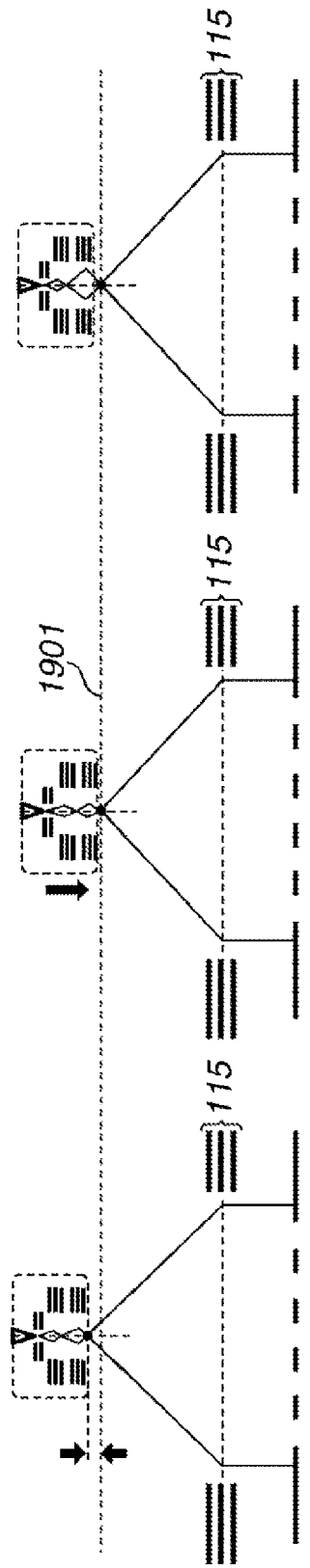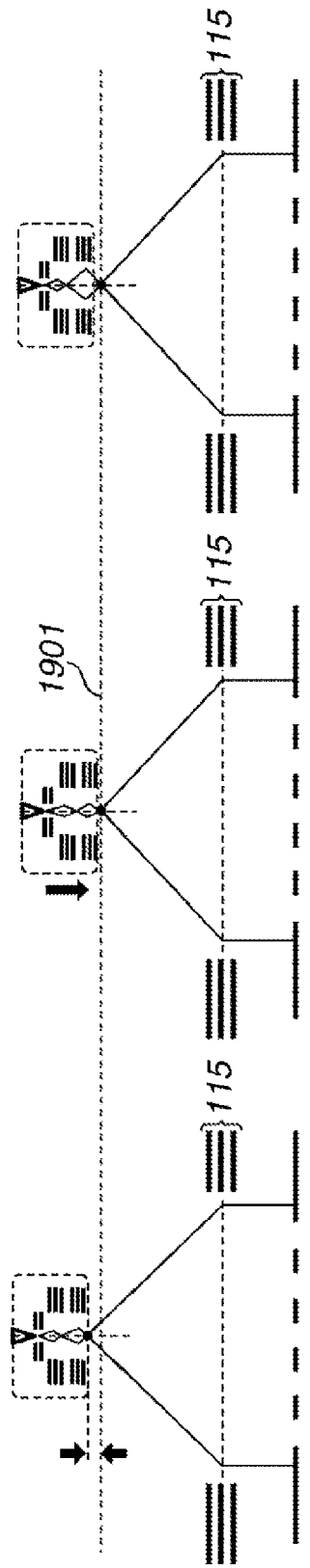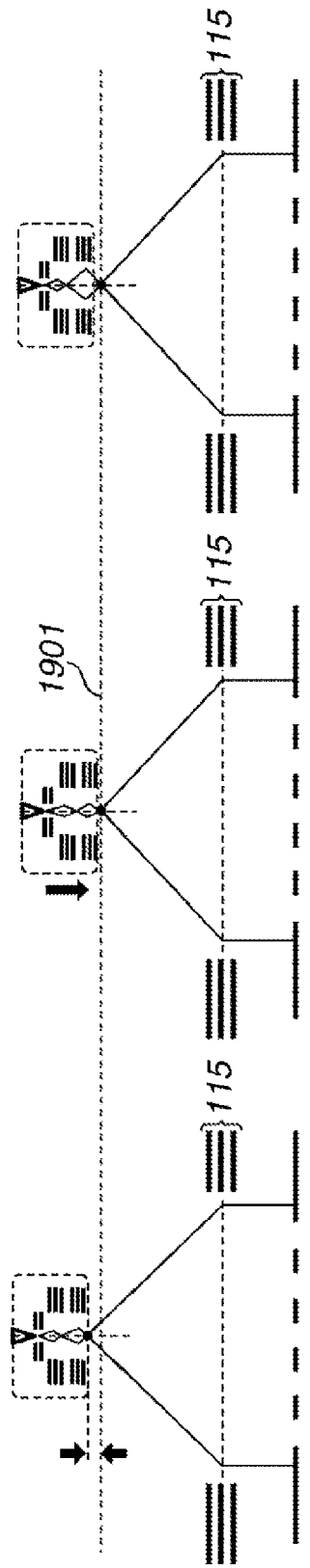

DRAWING APPARATUS AND METHOD OF MANUFACTURING ARTICLE

BACKGROUND OF THE INVENTION

1. Field of the Invention

Embodiments of the present invention relate to a drawing apparatus configured to perform drawing on a substrate with a plurality of charged particle beams.

2. Description of the Related Art

As one example of the drawing apparatuses, a multi-column drawing apparatus is known in which a projection unit is provided for each of the charged particle beams (see Japanese Patent Application Laid-Open No. 09-007538). Since projection units are provided independently, such a drawing apparatus does not have a crossover on which all of the charged particle beams converge. Thus, the influence of a coulomb effect is small, and such a drawing apparatus may effectively increase the number of charged particle beams.

However, in order to increase the number of charged particle beams in the multi-column drawing apparatus, it is generally necessary to increase the divergence angle (divergence half angle) of a charged particle beam from a charged particle source in an irradiation optical system which is located on the front side of the plurality of projection units. When the divergence angle of a charged particle beam from the charged particle source increases, the charged particle beams irradiated on the plurality of projection units are not easily made parallel sufficiently due to the aberration of the irradiation optical system. As a result, the irradiation angle (incidence angle) becomes non-uniform. Eventually, the non-uniformity of the irradiation angle causes non-uniformity of properties between the charged particle beams. However, there is an issue associated with the aberration of the irradiation optical system.

SUMMARY OF THE INVENTION

One disclosed aspect of the embodiments is directed to, for example, a drawing apparatus advantageous in terms of uniformity in a property with respect to a plurality of charged particle beams although the drawing apparatus includes an irradiation optical system of which irradiation angles are not uniform.

According to an aspect of the embodiments, a drawing apparatus configured to perform drawing on a substrate with a plurality of charged particle beams includes an irradiation optical system including a collimator lens on which a diverging charged particle beam is incident; an aperture array configured to split the charged particle beam from the irradiation optical system into a plurality of charged particle beams; a converging lens array configured to form a plurality of crossovers of the plurality of charged particle beams from the aperture array; and a projection optical system including an element in which a plurality of apertures corresponding to the plurality of crossovers are formed, and a plurality of projection lenses corresponding to the plurality of apertures and configured to project charged particle beams from the plurality of apertures onto the substrate, wherein the converging lens array includes converging lenses disposed such that each of the plurality of crossovers, which are formed by the converging lenses from the charged particle beam incident on the aperture array at incidence angles associated with aberration of the irradiation optical system, is aligned with corresponding one of the plurality of apertures in the element.

According to an exemplary embodiment, it is possible to provide, for example, a drawing apparatus advantageous in terms of uniformity in a property with respect to a plurality of charged particle beams although the drawing apparatus includes an irradiation optical system of which irradiation angles are not uniform.

Further features and aspects of the embodiments will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the embodiments and, together with the description, serve to explain the principles of the invention.

FIGS. 5A and 5B are diagrams illustrating an aperture arrangement of an aperture array and a converging lens array and a charged particle beam arrangement on an image forming surface, respectively, in the case of the configuration of FIG. 4.

FIGS. 6A, 6B, and 6C are diagrams illustrating a difference in aperture arrangement of an aperture array and a converging lens array depending on the presence of a defocus of an irradiation optical system.

FIGS. 8A, 8B, and 8C are diagrams illustrating an aperture arrangement of an aperture array and a converging lens array and a charged particle beam arrangement on an image forming surface, respectively.

FIGS. 9A and 9B are diagrams illustrating charged particle beams reaching respective portions within a beam spot.

FIG. 11 is a diagram illustrating a configuration of a drawing apparatus according to a third exemplary embodiment.

FIGS. 17A, 17B, 17C, and 17D are diagrams illustrating the configuration and function of a collimator lens.

FIGS. 19A, 19B, and 19C are diagrams illustrating the adjustment of position of a crossover on the front side of a collimator lens.

DESCRIPTION OF THE EMBODIMENTS

Various exemplary embodiments, features, and aspects of the embodiments will be described in detail below with reference to the drawings.

Figure 1:
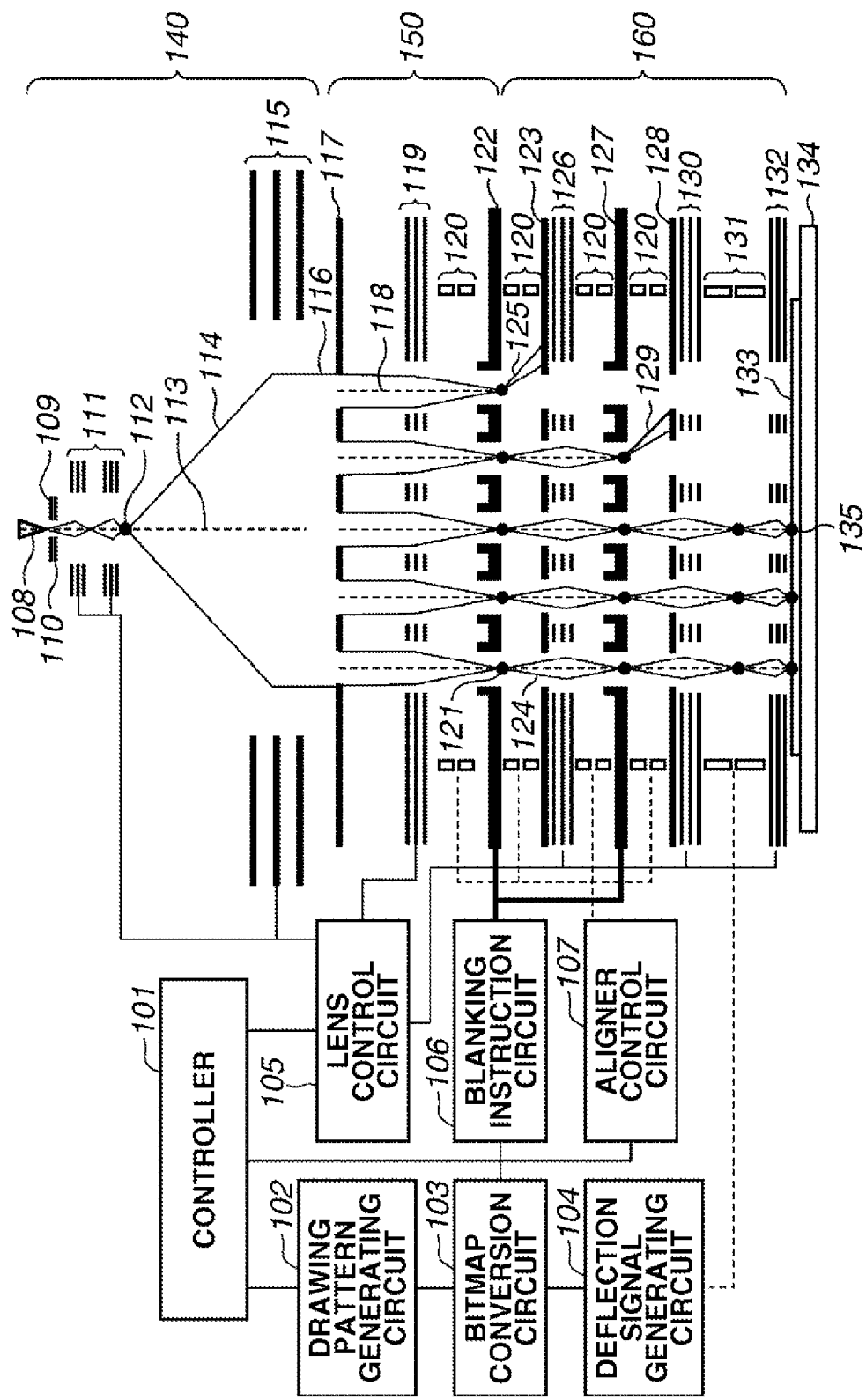
FIG. 1 is a diagram illustrating a configuration of a drawing apparatus according to a first exemplary embodiment.

FIG. 1 is a diagram illustrating a configuration of a drawing apparatus (a drawing apparatus configured to perform drawing on a substrate with a plurality of charged particle beams) according to a first exemplary embodiment of the present invention. The drawing apparatus of the present exemplary embodiment is a multi-column drawing apparatus in which a projection unit is provided for each charged particle beam. Although an example in which an electron beam is used as the charged particle beam is described, the charged particle beam is not limited to that, but another charged particle beam such as an ion beam may be used. In FIG. 1, electron beams emitted by an anode electrode 110 from an electron source 108 through the adjustment by a Wehnelt electrode 109 form a crossover 112 (irradiation system crossover) through a crossover adjustment optical system 111 (crossover adjustment system). In the present exemplary embodiment, the electron source 108 may be a thermionic electron source in which $LaB_6$ or BaO/W (dispenser cathode) is included in an electron emitter. The crossover adjustment optical system 111 includes two stages of electrostatic lenses, and each electrostatic lens may be an Einzel electrostatic lens which includes three electrodes, and in which a negative potential is applied to an intermediate electrode, and the upper and lower electrodes are grounded. The electron beams radiated with a wide angle from the crossover 112 become parallel beams by the collimator lens 115 and irradiate the aperture array 117.

The parallel beams irradiating the aperture array 117 are split by the aperture array 117 to become multi-electron beams 118 (plural electron beams). The multi-electron beams 118 are converged by a (first) converging lens array 119 and are focused on a blanker array 122. In the present exemplary embodiment, the converging lens array 119 may be an Einzel electrostatic lens array which includes three porous electrodes, and in which a negative potential is applied to an intermediate electrode of the three electrodes, and the upper and lower electrodes are grounded. The aperture array 117 is placed at the position (the position of a front-side focal plane of the converging lens array 119) of a pupil plane of the converging lens array 119 so that the aperture array 117 has a function of defining the area of electron beams passing through the pupil plane of the converging lens array 119.

The blanker array 122 is a device including deflection electrodes (more exactly, a deflection electrode pair) which may be controlled individually. The blanker array 122 performs blanking by deflecting the multi-electron beams 118 individually based on a blanking signal generated by a drawing pattern generating circuit 102, a bitmap conversion circuit 103, and a blanking instruction circuit 106. No voltage may be applied to the deflection electrodes of the blanker array 122 when electron beams are not blanked, whereas a voltage may be applied to the deflection electrodes of the blanker array 122 when electron beams are blanked. In the present exemplary embodiment, the electron beams deflected by the blanker array 122 are blocked by a stop aperture array 123 located on the rear side, whereby a blanking state is realized. In the present exemplary embodiment, the blanker array and the stop aperture array include two stages. More specifically, a (second) blanker array 127 and a (second) stop aperture array 128 having the similar structure as the (first) blanker array 122 and the (first) stop aperture array 123 are disposed on the rear side.

The multi-electron beams 118 having passed through the blanker array 122 are focused on the second blanker array 127 by the second converging lens array 126. In addition, the multi-electron beams 118 are converged by third and fourth converging lenses 130 and 132 and are focused on a wafer 133 (substrate). In the present exemplary embodiment, the second, third, and fourth converging lens arrays 126, 130, and 132 may be an Einzel electrostatic lens array similarly to the first converging lens array 119.

In the present exemplary embodiment, the fourth converging lens array 132 is an objective lens array, and the projection magnification thereof is set to about 1/100, for example. As a result, a spot diameter (which is 2 μm by full width at half maximum (FWHM)) of an electron beam 121 on an intermediate image forming surface on the blanker array 122 is reduced on the wafer 133 by about 1/100 to become a spot diameter of about 20 nm by FWHM.

Scanning (sweeping) of the multi-electron beams 118 on the wafer 133 may be performed using a deflector 131. The deflector 131 is formed by counter electrode pairs, and for example, may be configured by four stages of counter electrode pair to perform two stages of deflection with respect to each of X and Y directions (in FIG. 1, for the sake of simplicity, two stages of deflector is illustrated as one unit). The deflector 131 is driven according to a signal generated by a deflection signal generating circuit 104.

During drawing of patterns, a stage 134 holding the wafer 133 is continuously moved in the X direction. In parallel with this, the electron beam 135 on the wafer is deflected in the Y direction by the deflector 131 based on the real-time measurement results of the position of the stage 134 by a position measuring equipment (for example, one using a laser distance measuring machine). In parallel with them, blanking of an electron beam is performed according to a drawing pattern by the first and second blanker arrays 122 and 127. With such an operation, patterns may be drawn on the wafer 133 at high speed.

An electron (charged particle) optical system described above may be roughly split into the following three parts. The first part is an irradiation optical system 140 (also referred to as an irradiation system), which includes the elements from the electron source 108 to the collimator lens 115. The second part is a multi-beam forming optical system 150, which includes the aperture array 117 splitting the electron beam exiting the irradiation optical system 140 into multi-electron beams and the converging lens array 119 forming a plurality of crossovers from the multi-electron beams. The multi-beam forming optical system 150 is also simply referred to as a multi-beam forming system. The third part is a projection optical system 160, which includes an element in which a plurality of apertures corresponding to the plurality of crossovers is provided and a plurality of projection optical units provided to the plurality of apertures and configured to project an electron beam (crossover) onto the wafer (substrate). In the present exemplary embodiment, the element is the blanker array 122, for example. The projection optical unit is also simply referred to as a projection unit, and the projection optical system is simply referred to as a projection system. The present exemplary embodiment is characterized in the configuration of the multi-beam forming optical system 150.

Figure 2:
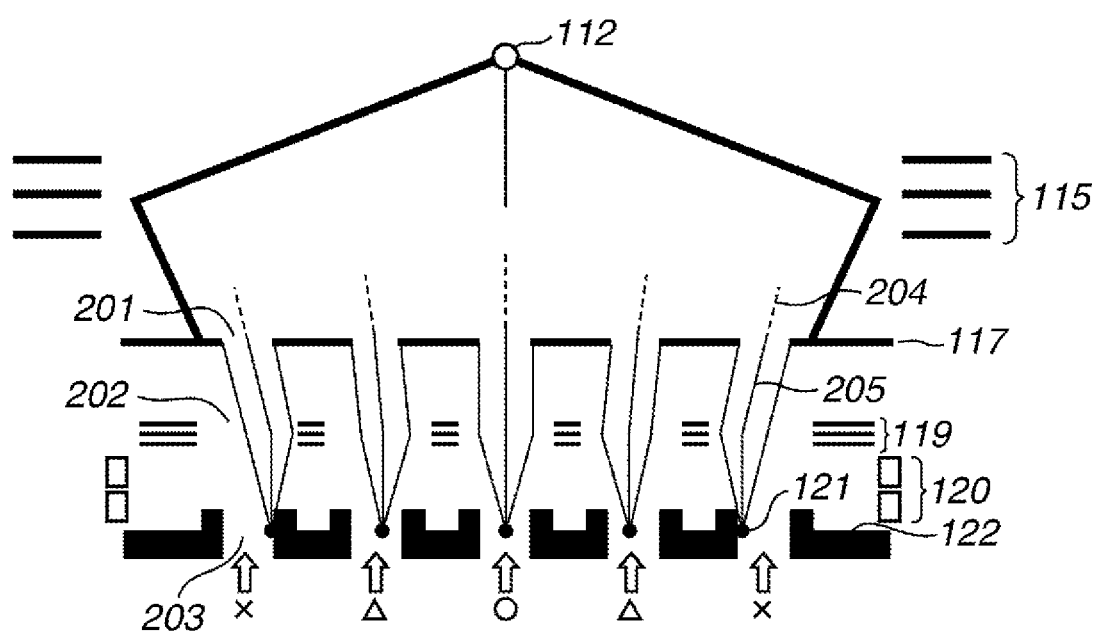
FIG. 2 is a diagram illustrating charged particle beams passing through an aperture array and a converging lens array in a case where the embodiments are not applied.

FIG. 2 is a diagram illustrating electron beams passing through an aperture array and a converging lens array when the present invention is not applied. FIG. 2 illustrates a portion including the multi-beam forming optical system 150 in FIG. 1. In FIG. 2, electron beams radiated with a wide angle from the crossover 112 are incident on the collimator lens 115 and are collimated (made approximately parallel) by the collimator lens 115. However, when the divergence angle (divergence half angle) of electron beams is large, the electron beams are not made exactly parallel due to an aberration of the irradiation optical system 140, but such a non-uniformity occurs that the irradiation angles (incidence angles) thereof are different depending on the position in an electron beam receiving surface. In the present exemplary embodiment, the aberration of the irradiation optical system includes spherical aberration of the crossover adjustment optical system 111, spherical aberration of the collimator lens 115, and aberration (this aberration may correspond to a spherical aberration of a concave lens) due to a space-charge effect between the electron source and the aperture array 117. For example, when spherical aberration of the collimator lens 115 is dominant among the aberrations of the irradiation optical system 140, electron beams 204 incident on the aperture array 117 are inclined more inside as the electron beams are located more outside due to spherical aberration (positive spherical aberration) of a convex lens. Therefore, principal rays 205 of the multi-electron beams having passed through the aperture array are also inclined more inside as the principal beams are located more outside.

As a result, the electron beams having passed through the converging lens array 119 deviate closer to the inner side from desired positions on the blanker array 122 as the electron beams are located closer to the outer side. In this way, the beam arrangement of the multi-electron beams becomes non-uniform, and the electron beams on the outer side do not pass through the centers of the apertures 203 of the blanker array 122. As a result, the deflection properties of the blanker array 122 become non-uniform.

Conversely, when the effect of the aberration due to the space-charge effect is dominant, the electron beams 204 incident on the aperture array 117 may be inclined more outside as the electron beams are located more outside due to spherical aberration (negative spherical aberration) of the concave lens. Therefore, the sum of spherical aberrations, respectively formed by the crossover adjustment optical system 111, the collimator lens 115 and the space-charge effect, determines an angular distribution of electron beams. More specifically, whether the electron beams located more outside will be inclined more inside or more outside is determined by the sum. In the exemplary embodiment of the present specification, a case where the aberrations of the irradiation optical system have non-uniformity such that spherical aberration of the collimator lens 115 is dominant and the electron beams incident on the aperture array are inclined more inside as the electron beams are located more outside will be described.

Figure 3A:
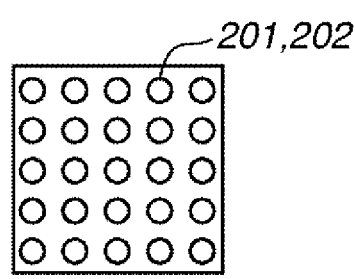
FIGS. 3A and 3B are diagrams illustrating an aperture arrangement of an aperture array and a converging lens array and a charged particle beam arrangement on an image forming surface, respectively, in the case of the configuration of FIG. 2.
Figure 3B:
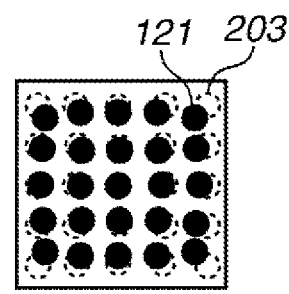

FIGS. 3A and 3B are diagrams illustrating an aperture arrangement of an aperture array and a converging lens array and an arrangement of electron beams on an image forming surface, respectively, in the configuration of FIG. 2. An aperture arrangement 201 of the aperture array and an aperture arrangement 202 of the converging lens array in FIG. 3A are made identical to an aperture arrangement 203 of the blanker array in FIG. 3B. Although a case where the apertures 203 of the blanker array have a square lattice-shaped arrangement is illustrated as an example, the present invention is not limited to that. For example, another arrangement having periodicity such as a checkerboard lattice-shaped arrangement may be used. As illustrated in FIG. 3B, as described above, the positions of the electron beams 121 on the image forming surface (or the blanker array) are closer to the inner side in relation to the positions of the apertures 203 of the blanker array as the electron beams are located closer to the outer side due to the aberrations of the irradiation optical system. More specifically, the beam arrangement 121 on the blanker array (the image forming surface) deviates in relation to the arrangement of the apertures 203 of the blanker array. Therefore, assuming that aberrations of the irradiation optical system are present, it is not desirable to make the arrangement of the apertures 201 of the aperture array and the arrangement of the apertures 202 of the converging lens array identical to the arrangement of the aperture array 203 of the blanker array.

Figure 4:
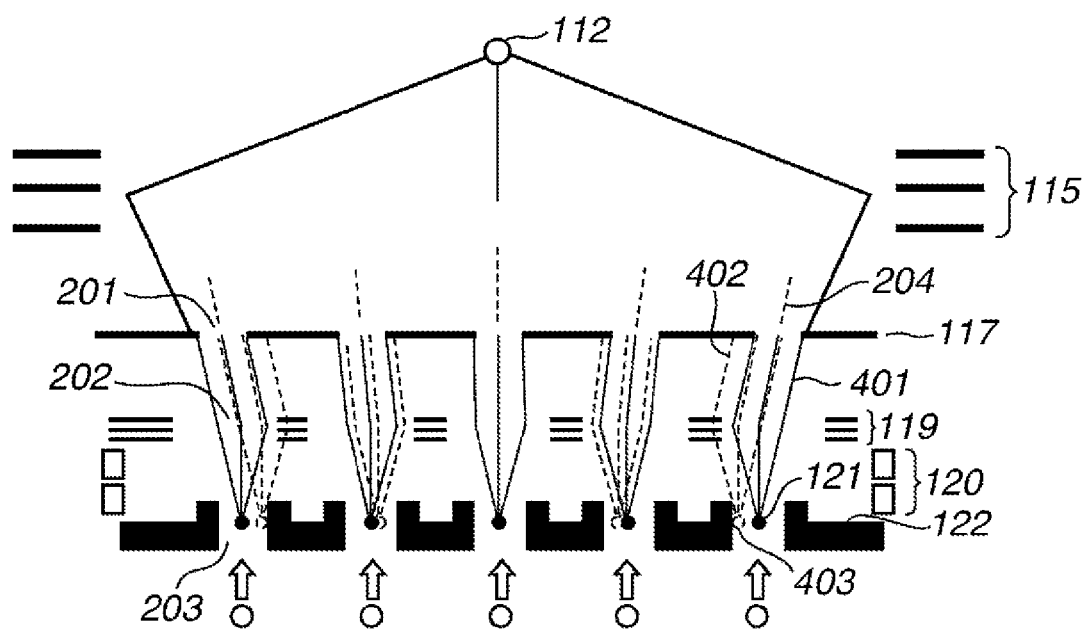
FIG. 4 is a diagram illustrating charged particle beams passing through an aperture array and a converging lens array in the case of the first exemplary embodiment.

In contrast, FIG. 4 is a diagram illustrating electron beams passing through the aperture array and the converging lens array in the first exemplary embodiment. In FIG. 4, the positions of the respective apertures of the aperture array 117 and the converging lens array 119 deviate by the same amount in relation to the positions (the positions of desired electron beams) of the corresponding apertures on the blanker array 122 (or the image forming surface). In the present exemplary embodiment, the same amount means not only a case where the amounts are exactly identical but also a case where the amounts are not identical, due to a manufacturing error or a layout error, within an allowable range set from the precision required for a drawing apparatus. The amount of displacement (eccentricity) of the aperture position may be set based on the incidence angle of an electron beam corresponding to the aberration of the irradiation optical system. The incidence angle may be set by a function of a distance, for example, a third-order polynomial (described below), from a blanker center (the center of the blanker array 122) at the position on the blanker array 122.

Trajectories 401 of the multi-electron beams when the positions of the apertures of the aperture array 117 and the converging lens array 119 deviate by taking the incidence angles of the electron beams into consideration are as illustrated in FIG. 4. More specifically, such trajectories are obtained that the arrangement of electron beams on the blanker array 121 (or the image forming surface) is identical to the arrangement of the centers of the apertures 203 of the blanker array 122. By correcting the non-uniformity of the beam arrangement of the multi-electron beams in such a manner, the electron beams on the outer side also pass through the centers of the apertures 203 of the blanker array 122, whereby the deflection properties of the blanker array 122 are improved. In FIG. 4, for the sake of comparison, the trajectories 402 of the multi-electron beams in the configuration of FIG. 2 are depicted by dotted lines.

FIGS. 5A and 5B are diagrams illustrating an aperture arrangement of an aperture array and a converging lens array and the arrangement of electron beams on the image forming surface (or the blanker array 122) in the first exemplary embodiment. FIG. 5A illustrates the aperture arrangement of an aperture array and a converging lens array, obtained by displacing the positions of the respective apertures 201 of the aperture array and the positions of the respective apertures 202 of the converging lens array by the same amount in relation to the positions of the corresponding apertures 203 of the blanker array. FIG. 5B illustrates the arrangement of electron beams on the image forming surface, and the arrangement of electron beams matches a desired arrangement of electron beam as a result of correction. In the present exemplary embodiment, matching means that a deviation of the positions of respective electron beams in relation to target positions is within a tolerance range.

In the present exemplary embodiment, the aperture array 117 may be placed on the pupil plane (front-side focal plane) of the converging lens array 119. In a state where the aperture array 117 is placed on the pupil plane of the converging lens array 119, when the aperture arrangement 201 of the aperture array and the aperture arrangement 202 of the converging lens array deviate by the same amount, the area of electron beams passing through the pupil plane of the converging lens array 119 does not change. Thus, even when the aperture positions of the aperture array and the converging lens array are displaced by the same amount while maintaining a state where the aperture centers thereof are on the same axis, the angles of the principal rays of the multi-electron beams incident on the image forming surface may be maintained to be uniform. More specifically, by performing the correction described above by disposing the aperture array 117 on the front-side focal plane of the converging lens array 119, the non-uniformity of the beam arrangement of the multi-electron beams on the image forming surface may be corrected. In addition, the uniformity of the incidence angles on the image forming surface may be maintained.

When there is a parallel eccentricity between the aperture array 117 and the converging lens array 119, the area of electron beams passing through the pupil plane of the converging lens array 119 changes uniformly over all of the multi-electron beams. Thus, all of the multi-electron beams on the image forming surface are inclined uniformly. Such a uniform inclination may be easily corrected in a lump by an aligner deflector 120. In the present exemplary embodiment, the issue is the non-uniformity occurring due to the individual inclination of multi-electron beams, and the present invention is directed to suppressing the non-uniformity occurring due to aberration of the irradiation optical system.

In the first exemplary embodiment, the amount of deviation of the aperture arrangement 201 of the aperture array and the aperture arrangement 202 of the converging lens array is specifically determined by three parameters in addition to the distance (image height) Y from the center of the blanker array to an electron beam on the blanker array. The three parameters include a spherical aberration coefficient Cs of the irradiation optical system, and the focal length f and the defocus adjustment amount $\Delta f$ the collimator lens. In the present exemplary embodiment, although the defocus adjustment amount $\Delta f$ may be adjusted by the crossover adjustment optical system 111, the present invention is not limited to that, and the defocus adjustment amount may be adjusted by changing the power of the collimator lens, for example.

In the present exemplary embodiment, the spherical aberration coefficient Cs of the irradiation optical system may be expressed by an expression, Cs=Cs(CO_adjust)+Cs(CL)+Cs (Coulomb). Cs(CO_adjust) is the spherical aberration coefficient of the crossover adjustment optical system, Cs(CL) is the spherical aberration coefficient of the collimator lens, and Cs(Coulomb) is the spherical aberration coefficient due to a space-charge effect.

The amount of angular deviation $\Delta\theta$ of electron beam due to aberration of the irradiation optical system may be approximately expressed by $\Delta\theta=Cs(Y/f)^3+\Delta f(Y/f)$ using the above parameters. This expression is a third-order polynomial in terms of the distance Y.

FIGS. 6A, 6B, and 6C are diagrams illustrating a difference in aperture arrangement of an aperture array and a converging lens array depending on the presence of a defocus of an irradiation optical system in the first exemplary embodiment. FIG. 6A illustrates the aperture arrangement 201 of the aperture array and the aperture arrangement 202 of the converging lens array when the defocus adjustment amount $\Delta f$ is 0 (defocus amount is zero). FIG. 6B illustrates the aperture arrangement 201 of the aperture array and the aperture arrangement 202 of the converging lens array when defocus adjustment is performed (defocusing is performed). FIG. 6C is a graph in which the distance (image height) Y is on the horizontal axis, and the amount of angular deviation of an electron beam due to aberration of the irradiation optical system is on the vertical axis (illustrating a case where Cs=5000 mm, f=500 mm, and $\Delta f$=1.5 mm). In the graph, the amount of angular deviation is positive when an electron beam is inclined inside.

In FIG. 6C, the amount of angular deviation of an electron beam when defocus adjustment is not present is proportional to the cube of the distance Y. Therefore, the aperture arrangement of the aperture array and the converging lens array is corrected to become an aperture arrangement having an amount of deviation proportional to the cube of the distance Y as illustrated in FIG. 6A.

On the other hand, in FIG. 6C, as for the amount of angular deviation of an electron beam when defocus adjustment is performed, a defocus term proportional to the distance Y is added in addition to the term proportional to the cube of the distance Y. Thus, as may be understood from FIG. 6C, as for the electron beam when defocus adjustment is performed, an electron beam in an area where the distance Y is small is inclined outside, whereas an electron beam in an area where the distance Y is large is inclined inside. Taking that into consideration, the aperture arrangement of the aperture array and the converging lens array is corrected in a manner such that an aperture 601 in an area where the distance Y is small deviates toward the inner side in relation to a desired beam arrangement on the image forming surface whereas an aperture 602 in an area where the distance Y is large deviates toward the outer side as illustrated in FIG. 6B.

As described above, when defocus adjustment is performed, an aperture arrangement pattern becomes somewhat complex. However, as apparent from the graph of FIG. 6C, the range of absolute values of the amount of angular deviation becomes smaller when defocus adjustment is performed. Thus, defocus adjustment provides an advantage in that the amount of deviation of the aperture arrangement of the aperture array and the converging lens array may be decreased. This may be easily understood when FIGS. 6A and 6B are compared with each other.

As described above, defocus adjustment has advantages and disadvantages. It should be understood that in all exemplary embodiments of the present invention, an aperture arrangement pattern of the aperture array and the converging lens array may be changed by defocus adjustment. Moreover, the aperture arrangement pattern illustrated in the exemplary embodiments is exemplary only, and an arrangement pattern configured to correct the non-uniformity of the angles of electron beams occurring due to aberration of the irradiation optical system also falls within the scope of the present invention.

Figure 7:
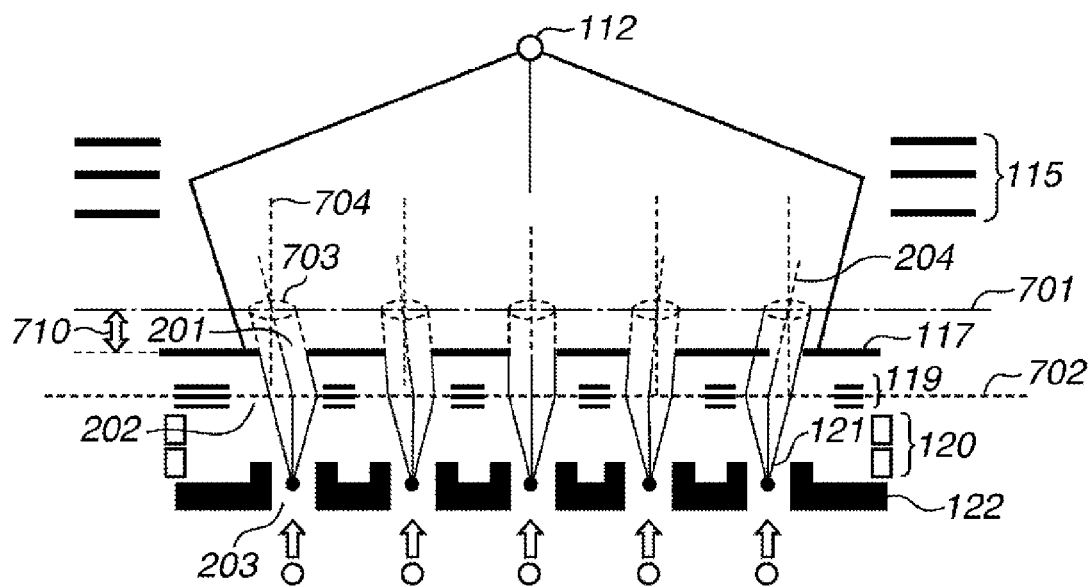
FIG. 7 is a diagram illustrating charged particle beams passing through an aperture array and a converging lens array according to a second exemplary embodiment.

FIG. 7 is a diagram illustrating electron beams passing through the aperture array 117 and the converging lens array 119 in a second exemplary embodiment of the present invention. FIG. 7 illustrates a portion corresponding to the multi-beam forming optical system 150 of FIG. 1, and the other constituent elements of the present exemplary embodiment are similar to those of the first exemplary embodiment.

In FIG. 7, the aperture positions 202 of the converging lens array deviate according to a third-order polynomial in terms of the distance (image height) Y to correct the non-uniformity of the arrangement of electron beams on the image forming surface due to aberration of the irradiation optical system similarly to the first exemplary embodiment. Moreover, the position of the aperture array 117 is disposed at a position deviating from a front-side focal plane 701 of the converging lens array 119. Ideally, the position of the aperture array 117 may be placed on the front-side focal plane 701 of the converging lens array 119. However, there may be a case where an ideal layout is not possible, such as a case where it is difficult to secure amounting space or a case where the focal length of the converging lens array 119 is very long.

In such a case, as long as it is possible to accurately recognize an angular deviation of electron beams due to aberration of the irradiation optical system, multi-electron beams may be made incident with a uniform angle of principal ray in relation to the blanker array 122 (or the image forming surface) similarly to the first exemplary embodiment. In order to realize that, in FIG. 7, it is necessary to determine the aperture arrangement of the aperture array 117 so that a convergent angular distribution of electron beams due to the converging lens array 119 becomes uniform over all of the multi-electron beams.

More specifically, the convergent angular distribution of multi-electron beams is determined by a distribution of electron beams passing through the front-side focal plane 701 of the converging lens array 119. Thus, when it is possible to exactly recognize an angular deviation (angular distribution) of electron beams due to the aberration of the irradiation optical system, it is possible to define a distribution of electron beams passing through the front-side focal plane 701.

Specifically, a configuration as illustrated in FIG. 7 may be adopted. More specifically, similarly to the first exemplary embodiment, the aperture positions of the aperture array 117 may be determined so that the center of an (imaginary) electron beam distribution 703 on the front-side focal plane 701 of the converging lens array is on an optical axis 704 of the converging lens array.

For example, in FIG. 7, the position of the aperture array 117 is disposed approximately at the center between the converging lens array 119 and the front-side focal plane 701 of the converging lens array. In this case, the amount of deviation of the apertures 201 of the aperture array is approximately half the amount of deviation of the apertures 202 of the converging lens array. By doing so, the center of the (imaginary) electron beam distribution 703 on the front-side focal plane 701 of the converging lens array is located on the optical axis 704 of the converging lens array. More generally, the amount of deviation of the apertures 201 of the aperture array may be proportional to the distance 710 between the front-side focal plane of the converging lens array and the aperture array.

FIGS. 8A, 8B, and 8C are diagrams illustrating the aperture arrangement of an aperture array and a converging lens array and the arrangement of electron beams on the image forming surface in the second exemplary embodiment. FIG. 8A illustrates the arrangement of the apertures 202 of the converging lens array, FIG. 8B illustrates the arrangement of the apertures 201 of the aperture array, and FIG. 8C illustrates the arrangement of electron beams on the image forming surface. Circular dotted lines in FIGS. 8A and 8B illustrate the apertures 203 of the blanker array. In FIG. 8B, the amount of deviation of the apertures of the aperture array is set to be approximately half the amount of deviation of the apertures of the converging lens array to define the electron beam distribution 703 on the front-side focal plane 701 of the converging lens array as described above. As described above, even when the aperture array 117 is not disposed on the front-side focal plane 701 of the converging lens array, by adopting the configuration of the present exemplary embodiment, the same advantages as the first exemplary embodiments may be obtained.

However, as will be described with reference to FIGS. 9A, 9B, 10A, and 10B, it is useful to dispose the aperture array 117 on the front-side focal plane 701 of the converging lens array as close as possible similarly to the first exemplary embodiment. FIGS. 9A and 9B are diagrams illustrating electron beams reaching respective portions within a spot beam. FIG. 9A is a diagram illustrating electron beams reaching the respective portions within a spot beam according to the first exemplary embodiment, in which the aperture array 117 is placed on the front-side focal plane 701 of the converging lens array. Thus, on-axis and off-axis principal rays including a principal ray 901 of an off-axis beam advancing toward an outer-side portion of a spot beam image are parallel to the optical axis.

FIG. 9B is a diagram illustrating electron beams reaching the respective portions within a spot beam according to the second exemplary embodiment, in which the aperture array 117 is not placed on the front-side focal plane 701. In this case, as may be understood from FIG. 9B, an angular distribution of off-axis electron beams on the front-side focal plane 701 of the converging lens array is different from that of on-axis electron beams. More specifically, the principal ray 901 of an off-axis beam advancing toward the outer-side portion of a spot beam image is not parallel to the optical axis but is inclined. As a result, when a focus deviates, the beam spot tends to become blurred. More specifically, in the configuration of the second exemplary embodiment, it is not possible to make both the on-axis and off-axis principal rays parallel to the optical axis. However, this influence is small when the diameter of a beam spot on the image forming surface is small. Thus, in the configuration of the second exemplary embodiment, it is useful to decrease the diameter of a beam spot on the image forming surface to an extent such that the influence of an inclination of off-axis light beams is allowable.

Figure 10A:
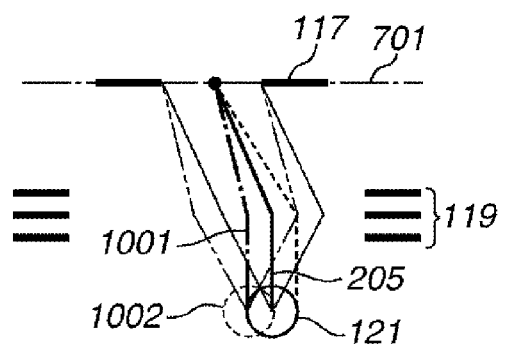
FIGS. 10A and 10B are diagrams illustrating the light beams when an estimate of the angle of a charged particle beam has an error.
Figure 10B:
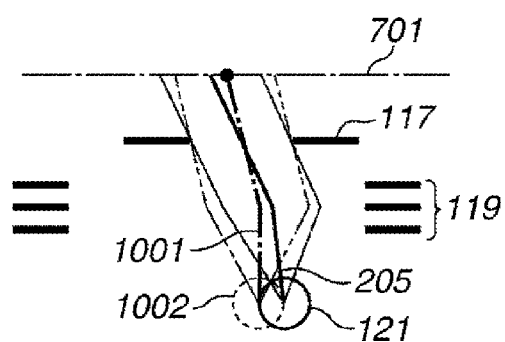

FIGS. 10A and 10B are diagrams illustrating electron beams when an estimate of an angular deviation of an electron beam has an error. FIG. 10A illustrates a case where an estimate of an angular deviation of an electron beam has an error in the first exemplary embodiment, in which an actual electron beam is denoted by a solid line, and an estimate electron beam is denoted by a dotted line. Since there is an estimation error, although an image forming position 121 of an electron beam deviates in relation to an estimated image forming position 1002, a principal ray 205 of the electron beam is parallel to the optical axis. This is because, even when there is an estimation error, the apertures 201 of the aperture array are on the front-side focal plane of the converging lens array.

FIG. 10B illustrates a case where an estimate of an angular deviation of an electron beam has an error in the second exemplary embodiment, in which an actual electron beam is denoted by a solid line, and an estimate electron beam is denoted by a dotted line. Since there is an estimation error, the image forming position 121 of an electron beam deviates in relation to the estimated image forming position 1002, and in the case of the second exemplary embodiment, the angle of the principal ray 205 of the electron beam also deviates. This is because the aperture array 117 is not on the front-side focal plane 701 of the converging lens array. As a result, as may be understood from FIG. 10B, the electron beam distribution on the front-side focal plane 701 of the converging lens array further deviates in relation to the estimate. More specifically, in the configuration of the second exemplary embodiment, when the estimate of the angular deviation of the electron beam has an error, it is necessary to pay attention to the fact that the angle of the principal ray 205 as well as the image forming positions 121 of the multi-electron beams deviate.

As described above, when employing the configuration of the second exemplary embodiment, it is necessary to decrease the diameter of a beam spot on the image forming surface to an extent such that the influence of an inclination of an off-axis beam is allowable and to pay attention to the influence on the angle of a principal ray, of an estimation error of the angular deviation of the electron beam.

FIG. 11 is a diagram illustrating the configuration of a drawing apparatus according to a third exemplary embodiment of the present invention. The irradiation optical system 140 and the multi-beam forming optical system 150 having different configurations from those of FIG. 1 will be described.

An electron source array 1110 is one in which a plurality of thermal field emission (TFE) electron sources is arranged. The thermal field emission electron source includes a thermal field emission emitter 1101, a suppressor electrode 1102, a first anode electrode 1103, and a second anode electrode 1104. The thermal field emission emitter 1101 corresponds to a cathode. The suppressor electrode 1102 has a function of restricting electron emission from portions other than a tip end of the cathode. The first and second anode electrodes 1103 and 1104 form an electric field for allowing electrons to be emitted from the thermal field emission emitter 1101. The thermal field emission emitter 1101 emits electrons by a combination of a thermionic emission effect by heating and a Shottky effect under a strong electric field by an anode electrode. A group of electron beams emitted from the thermal field emission emitters 1101 arranged in an array shape form (irradiation optical system) crossovers 112 arranged in an array shape by the crossover adjustment optical systems 111 arranged similarly in an array shape. In the present exemplary embodiment, a thermal field emission cathode material such as ZrO/W is used for the thermal field emission emitter 1101.

Electron beams 114 radiated from the crossovers 112 arranged in an array shape are made parallel by a collimator lens array 1105 and form a plurality of electron beams which do not overlap each other. The plurality of electron beams irradiates a plurality of subarray areas (each including a plurality of apertures) on the aperture array 117.

As may be understood from FIG. 11, with regard to one array among the plurality of electron source arrays 1110, the configuration of the optical system thereof is equivalent to that of FIG. 1. Thus, the configuration of the above-described exemplary embodiment may be applied to the optical systems corresponding to the respective electron sources (respective subarray areas) in parallel.

Figures 12A, 12B:
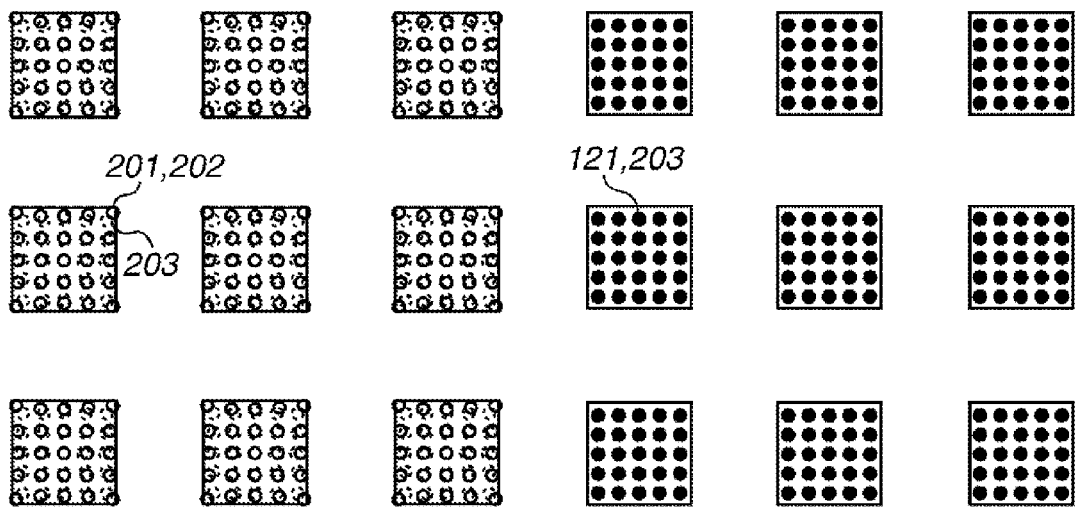
FIGS. 12A and 12B are diagrams illustrating an aperture arrangement of an aperture array and a converging lens array and a charged particle beam arrangement on an image forming surface, respectively.

FIGS. 12A and 12B are diagrams illustrating the aperture arrangement of an aperture array and a converging lens array and the arrangement of electron beams on the image forming surface in the third exemplary embodiment. FIG. 12A illustrates the aperture arrangement of an aperture array and a converging lens array in a 3×3 subarray area in the present exemplary embodiment, and FIG. 12B illustrates the arrangement 121 of electron beams on the image forming surface in the 3×3 subarray area.

As illustrated in FIG. 12A, in the respective subarray areas, the apertures 201 of the aperture array and the apertures 202 of the converging lens array deviate in relation to the apertures 203 of the blanker array to correct the non-uniformity of the angles of electron beams due to aberration of the irradiation optical system. Since a plurality of irradiation optical systems having the similar configuration is arranged in parallel, the aperture arrangement of the aperture array and the converging lens array is similar in any subarray area. In FIG. 12A, the aperture array 117 is placed on the front-side focal plane 701 of the converging lens array, and the apertures 201 of the aperture array and the apertures 202 of the converging lens array deviate by the similar amount.

By applying the configuration of the first exemplary embodiment to each subarray area as illustrated in FIG. 12A, the non-uniformity of multi-electron beams is corrected as illustrated in FIG. 12B. As described above, when the irradiation optical systems are provided in parallel, the present invention may be applied to the plurality of irradiation optical systems in parallel. Thus, even when the above-described defocus adjustment of the irradiation optical system is performed, as for the aperture arrangement of the aperture array and the converging lens array, the arrangement illustrated in FIGS. 6A to 6C may be applied to each irradiation optical system (subarray area). Moreover, even when the aperture array 117 is disposed to deviate from the front-side focal plane 701 of the converging lens array, it is apparent that as for the aperture arrangement of the aperture array and the converging lens array, the arrangement illustrated in FIG. 8 may be applied to each irradiation optical system (subarray area).

Figure 13:
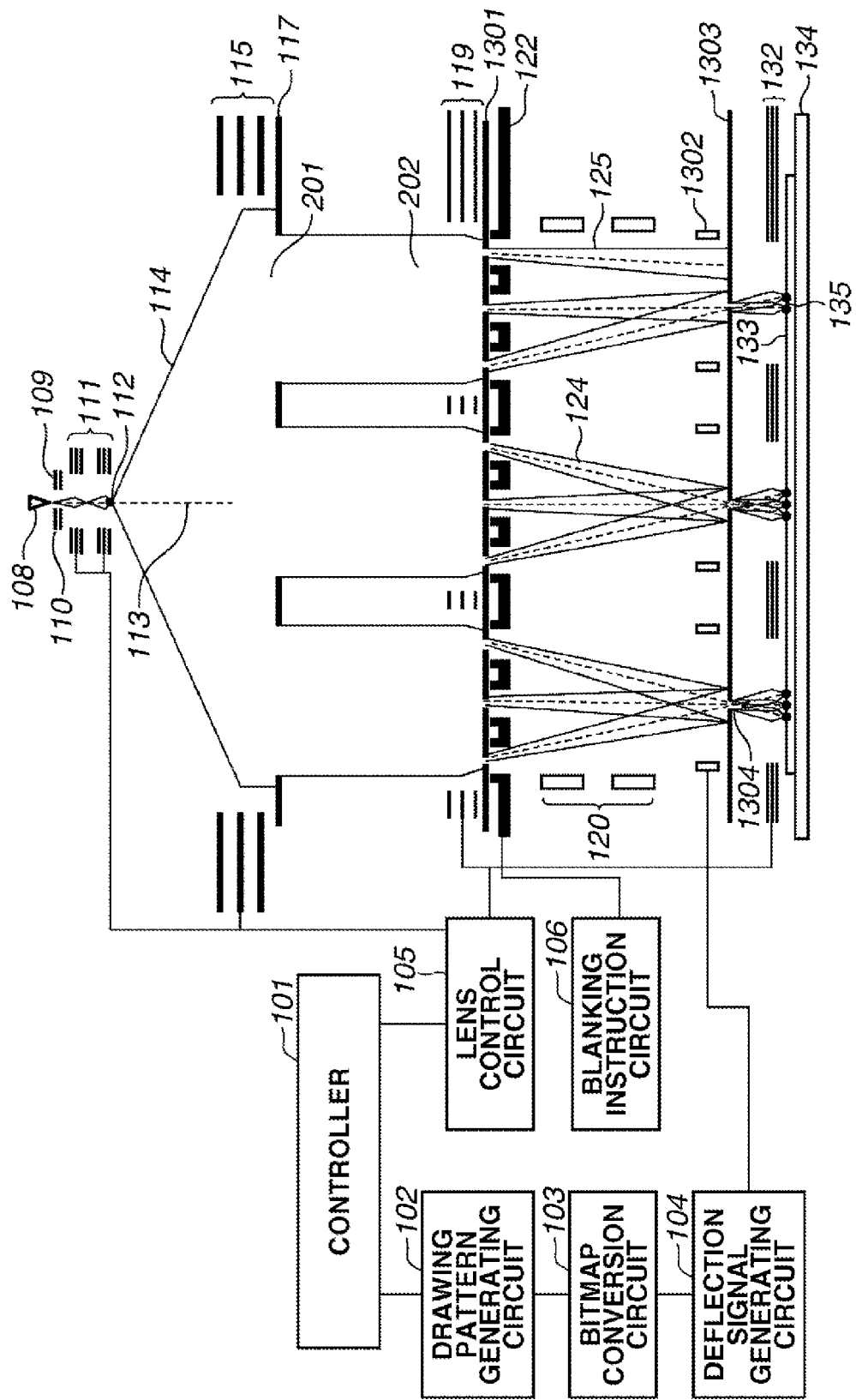
FIG. 13 is a diagram illustrating a configuration of a drawing apparatus according to a fourth exemplary embodiment.

FIG. 13 is a diagram illustrating the configuration of a drawing apparatus according to a fourth exemplary embodiment of the present invention. In FIG. 13, since the configuration from the electron source 108 to the aperture array 117 is similar to that of FIG. 1, the description thereof is not repeated, and the constituent elements located closer to the rear side than the aperture array 117 will be described.

The multi-electron beams formed by the aperture array 117 are converged by the converging lens array 119. In the fourth exemplary embodiment, the powers of the respective lenses of the converging lens array 119 are set so that the multi-electron beams converge on a stop aperture array 1303 on the rear side. Immediately after passing through the converging lens array 119, the multi-electron beams are further split into submulti-electron beams by a projecting aperture array 1301. FIG. 13 illustrates a state where one multi-electron beam is split into 3×3 submulti-electron beams.

Since the powers of the respective lenses of the converging lens array 119 are set as described above, the submulti-electron beams converge on the stop aperture array 1303. In the present exemplary embodiment, in the stop aperture array 1303, an aperture is provided for each submulti-electron beam. The arrangement of the apertures 1304 of the stop aperture array 1303 is configured to be identical to the arrangement of the apertures at the center of the 3×3 sub-aperture arrays of the projecting aperture array 1301.

The blanker array 122 is provided right below the projecting aperture array 1301, so that similarly to the configuration of FIG. 1, an operation of blanking respective electron beams may be performed by individual deflection. When it is desired to blank (block) an electron beam, a voltage is applied to the corresponding electrode pair of the blanker array 122, whereby the electron beam is blocked by the stop aperture array 1303. FIG. 13 illustrates an electron beam 125 deflected (blocked) by the blanker array 122.

The submulti-electron beams having passed through the stop aperture array 1303 are converged by the second converging lens array 132 and are focused on the surface of the wafer 133. The projecting aperture array 1301 is disposed on the image plane of the second converging lens array 132, and a 3×3 aperture pattern of the projecting aperture array 1301 is reduced and projected onto the surface of the wafer 133 by the respective lenses of the second converging lens array 132. For example, the aperture diameter of the projecting aperture array 1301 is set to 2.5 μm, and the projection magnification of the second converging lens array 132 is set to 1/100. As a result, an image having a diameter of 25 nm is formed on the surface of the wafer 133. In addition, the stop aperture array 1303 is disposed on the front-side focal plane of the second converging lens array 132 to define an area of electron beams passing through the pupil plane of the second converging lens array 132.

A deflector array 1302 is disposed near the stop aperture array 1303, so that similarly to the configuration of FIG. 1, deflection (scanning) of submulti-electron beams may be performed. More simply, the deflector array 1302 may be driven by a common application voltage, and the electrode structure thereof may be formed of a comb tooth-shaped confronting electrode.

Figure 14A:
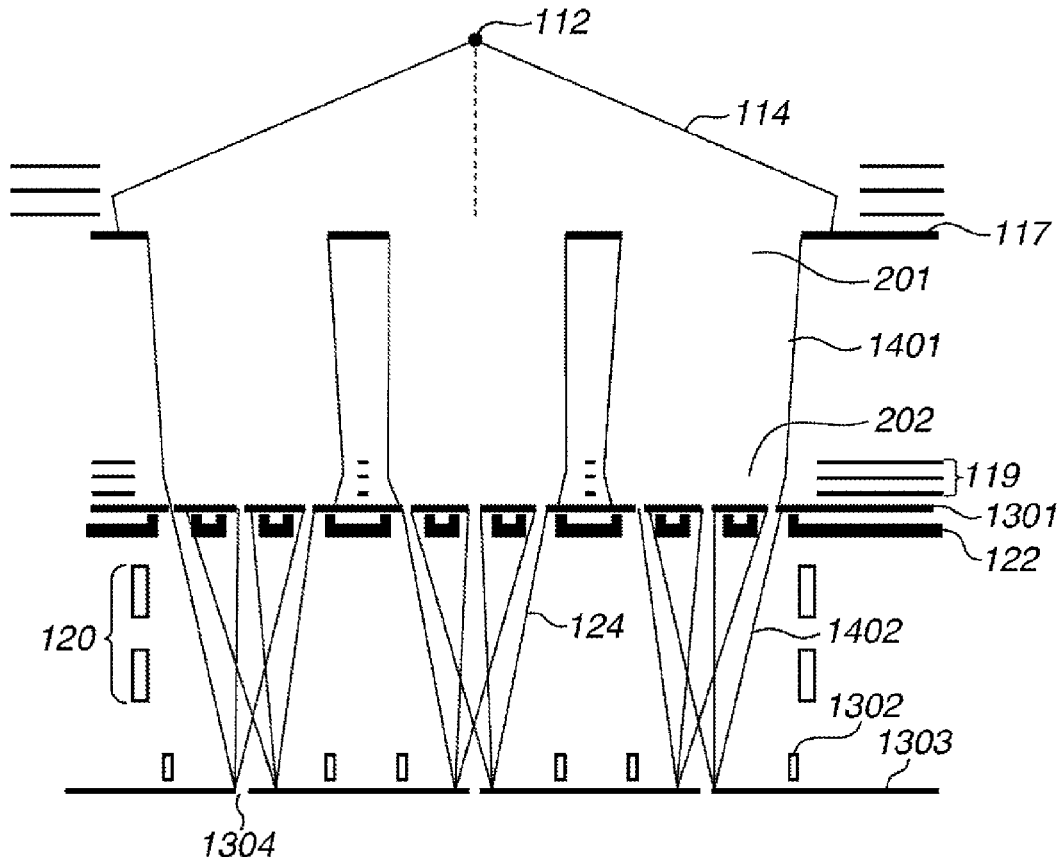
FIGS. 14A, 14B, and 14C are diagrams illustrating charged particle beams passing through an aperture array and a converging lens array, an aperture arrangement of the aperture array and the converging lens array and a charged particle beam arrangement on an image forming surface, respectively, in a case where the embodiments are not applied.
Figure 14B:
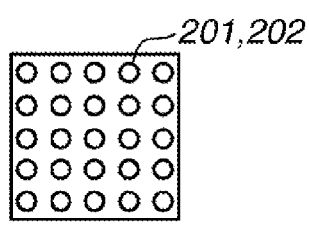
Figure 14C:
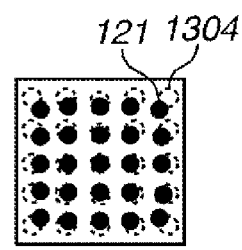

FIGS. 14A, 14B, and 14C are diagrams illustrating electron beams passing through an aperture array and a converging lens array and the arrangement of electron beams on a stop aperture array in the configuration (in a case where the present invention is not applied) of FIG. 13.

When the angular distribution of electron beams becomes non-uniform due to aberration of an irradiation optical system, the arrangement of electron beams (crossovers) formed on the stop aperture array 1303 by the converging lens array 119 becomes non-uniform. More specifically, the arrangement of spots of submulti-electron beams of the stop aperture array 1303 becomes non-uniform due to aberration of the irradiation optical system. FIG. 14C illustrates the arrangement thereof, in which such a non-uniformity occurs that electron beams converge closer to the inside in relation to a desired position (the position of an aperture 1304 of the stop aperture array) as the electron beams are located closer to the outside (as the image height increases) as illustrated in FIG. 3B.

In the present exemplary embodiment, since the multi-electron beams are further split into submulti-electron beams by the projecting aperture array 1301, the influence of shifting of electron beams radiated on the projecting aperture array 1301 needs to be taken into consideration. As may be understood from FIG. 14A, electron beams radiated on the projecting aperture array 1301 are shifted closer to the inside as the electron beams are located closer to the outside due to aberration of the irradiation optical system. As a result, the respective principal rays of the submulti-electron beam are inclined more inside as the principal rays are located more outside due to aberration of the irradiation optical system (this may be understood by comparing a group of electron beams at the center of FIG. 14A with a group of electron beams on the left and right side). Therefore, the angular distribution of electron beams defined by the stop aperture array 1303 is different depending on the subarray area. As a result, the arrangement and the intensity (current intensity) of electron beams on the surface of the wafer 133 become non-uniform.

Figure 15A:
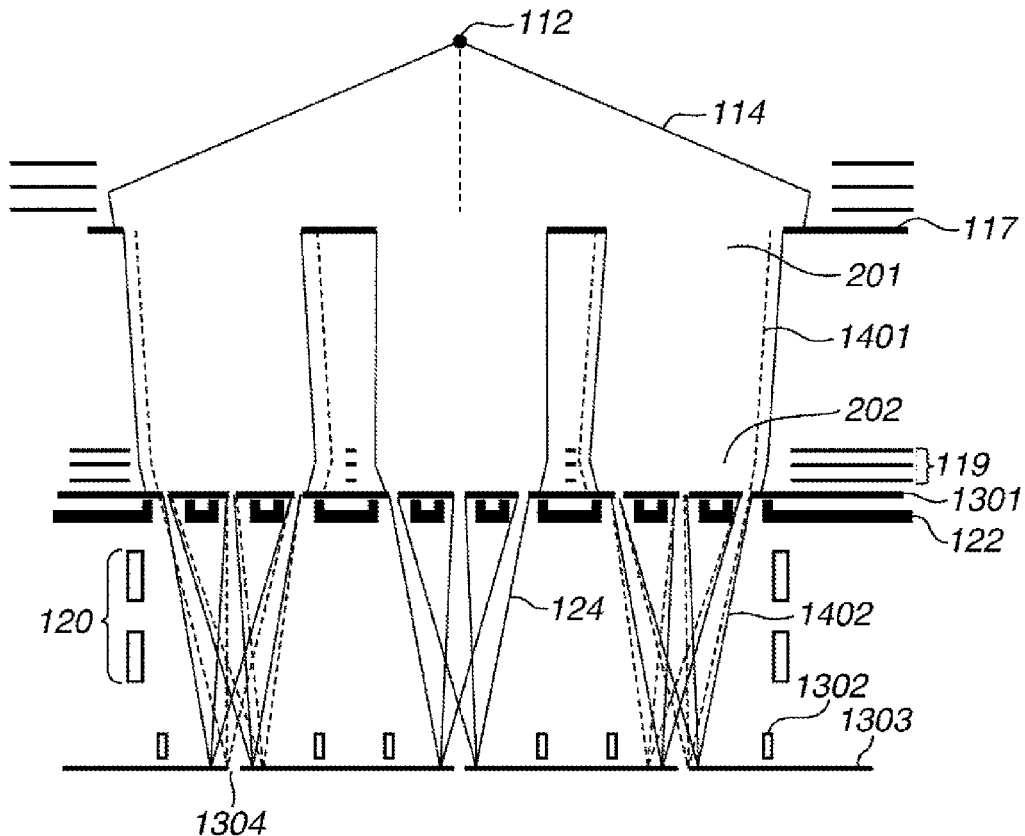
FIGS. 15A, 15B, and 15C are diagrams illustrating charged particle beams passing through an aperture array and a converging lens array, an aperture arrangement of the aperture array and the converging lens array and a charged particle beam arrangement on an image forming surface, respectively, in the case of the fourth exemplary embodiment.
Figure 15B:
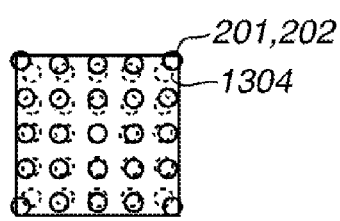
Figure 15C:
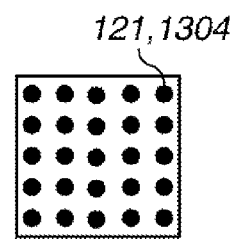

FIGS. 15A, 15B, and 15C are diagrams illustrating electron beams passing through an aperture array and a converging lens array and the arrangement of electron beams on a stop aperture array when the present invention is applied to the configuration of FIG. 13. In the present exemplary embodiment, the non-uniformity is corrected by arranging the apertures 201 of the aperture array and the apertures 202 of the converging lens array to deviate according to a third-order polynomial in terms of the distance (image height) as illustrated in FIG. 15B similarly to the first exemplary embodiment. All of the configurations used in the first and second exemplary embodiments are applicable to the present exemplary embodiment, and these configurations also fall within the scope of the embodiments.

According to the present exemplary embodiment as illustrated in FIGS. 15A to 15C, the non-uniformity may be corrected so that the respective principal rays of the submulti-electron beam are not inclined due to aberration of the irradiation optical system and converge on the centers of the apertures 1304 of the stop aperture array.

In the above exemplary embodiments, the arrangement of the apertures 201 of the aperture array and the apertures 202 of the converging lens array is determined according to the spherical aberration of the irradiation optical system. In practice, since spherical aberration of the irradiation optical system is estimated by simulation or actual measurement, this estimation may incur errors. Thus, when the estimation error exceeds an allowable value, the correction based on the arrangement of the apertures 201 of the aperture array and the apertures 202 of the converging lens array has non-allowable correction residues (errors). In such a case, it is undesirable to manufacture the aperture array and the converging lens array again from the perspective of manufacturing costs. In this respect, the following exemplary embodiments including a fifth exemplary embodiment are directed to a configuration advantageous when correction residues occur due to an estimation error of spherical aberration of the irradiation optical system. The configuration includes an adjustment unit that adjusts the aberration of the irradiation optical system. The adjustment unit adjusts the aberration so that the position of each of a plurality of crossovers which are incident on the aperture array at an incidence angle associated with the aberration and are formed by the converging lens array matches the corresponding aperture. The corresponding aperture is a corresponding aperture of an element such as the blanker array or the stop aperture array as described above.

Figure 16:
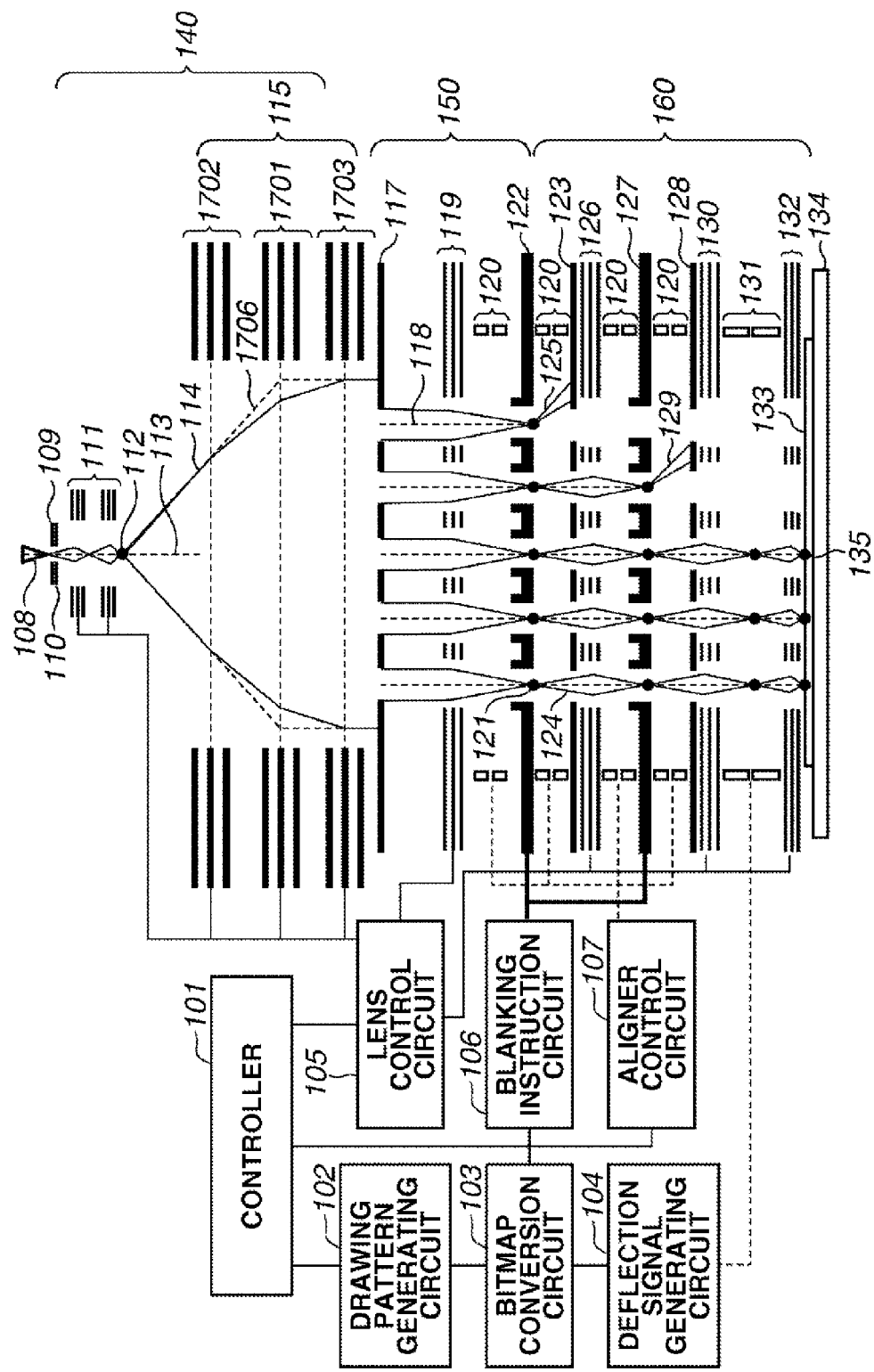
FIG. 16 is a diagram illustrating a configuration of a drawing apparatus according to a fifth exemplary embodiment.

FIG. 16 is a diagram illustrating a configuration of a drawing apparatus according to the fifth exemplary embodiment. Since the configuration of the present exemplary embodiment is characterized in the configuration of the collimator lens 115, the configuration thereof will be described. In the present exemplary embodiment, the collimator lens 115 includes three stages of lens (charged particle lens), in which diverging charged particle beams are collimated by a main collimator lens 1701 on the middle stage, a first adjustment lens 1702 on the upper stage, and a second adjustment lens 1703 on the lower stage. By configuring the collimator lens to have multiple stages (a plurality of charged particle lenses), it is possible to adjust spherical aberration of the irradiation optical system while maintaining the focal length of the collimator lens to be constant. In the present exemplary embodiment, the focal length of the collimator lens means the focal length (combined focal length) when multiple stages of collimator lens are regarded as one lens.

The above-described spherical aberration may be adjusted while maintaining the front-side focal point position (object plane-side focal point position) and the front-side principal plane position (object plane-side principal plane position) by individually controlling (adjusting) the powers of the first adjustment lens 1702, the main collimator lens 1701, and the second adjustment lens 1703, for example. In the present exemplary embodiment, the front-side focal point position and the front-side principal plane position mean the front-side focal point position and the front-side principal plane position when multiple stages of collimator lens are regarded as one lens. FIG. 16 illustrates a trajectory 1706 of an electron beam when the collimator lens includes one stage of electron lens. Moreover, the adjustment of the spherical aberration may be performed by moving the respective lenses in the multiple stages of collimator lens. In this case, a mechanism for driving the main collimator lens 1701, the first adjustment lens 1702, and the second adjustment lens 1703 may be provided as a unit associated with the movement of each of them (that is, three electrodes constituting the respective lenses form one unit). In addition, the spherical aberration may be adjusted by a combination of the adjustment of the powers of the respective electron lenses and the adjustment of the positions thereof. Although a collimator lens including three stages of electron lens has been illustrated, the configuration of the collimator lens is not limited to one which includes three stages of electron lenses but may include one which includes two or four or more stages of electron lens.

Such adjustment involves changing spherical aberration of the irradiation optical system by changing the path of an electron beam while fixing the front-side focal point position and the front-side principal plane position. More specifically, one kind of optical property is varied while fixing two kinds of optical properties. Thus, such adjustment may be realized with at least three control parameters in principle (mathematically). For example, in the above configuration example, three control parameters are used by varying the potentials applied to the three stages of electron lens. Moreover, when the collimator lens includes two stages of electron lens, for example, at least three control parameters may be used by adding the adjustment (movement) of at least one electron lens to the adjustment of the potentials applied thereto. Furthermore, when four or more stages of electron lens are included, the above adjustment may be realized by using at least three control parameters.

The above adjustment may be performed based on an estimation error amount of the spherical aberration of the irradiation optical system. The estimation error amount may be obtained by measuring a positional deviation of electron beams on the wafer 133, for example. More specifically, the positions of electron beams are measured in relation to a plurality of different image heights, for example, and it may be examined whether the amount of positional deviation of electron beams (the amount of deviation from a target position) has a correlation expressed by the above cubic function. If the amount of positional deviation of electron beams has a correlation, the adjustment may be performed using the coefficients of the cubic function as the estimation errors.

By configuring the collimator lens to have multiple stages as in the case of the present exemplary embodiment, the aberration (spherical aberration) may be adjusted while maintaining the optical properties other than the aberration (spherical aberration). In this way, the issue associated with the above correction residues may be solved. This will be described with reference to FIGS. 17A, 17B, 17C, and 17D. FIGS. 17A, 17B, 17C, and 17D are diagrams illustrating the configuration and the function of a multi-stage collimator lens. FIG. 17A is a graph illustrating a relation between a change of spherical aberration of a multi-stage collimator lens and a change of the amount of deviation of irradiation angle. FIG. 17B is a diagram illustrating the arrangement of the apertures 201 of the aperture array and the apertures 202 of the converging lens array determined in advance according to estimated spherical aberration of the irradiation optical system. As illustrated in FIG. 17A, the amount of deviation of the irradiation angle of electron beams due to the irradiation optical system may be adjusted by adjusting spherical aberration of a multi-stage collimator lens. Thus, even when the estimated spherical aberration of the irradiation optical system has an error in relation to the actual spherical aberration, the correction residues resulting from the estimation error of the spherical aberration may be suppressed (corrected) by adjusting spherical aberration of the irradiation optical system. In the present exemplary embodiment, since the aperture pattern of FIG. 17B is formed according to the value of the spherical aberration estimated in advance, the correction residues thereof are generally small. Therefore, such correction residues may be generally corrected by finely adjusting spherical aberration of the irradiation optical system.

FIGS. 17C and 17D illustrate an adjustment example of the spherical aberration due to a multi-stage collimator lens. In the adjustment in FIGS. 17C and 17D, it may be understood that the positions of a (combined) front-side focal plane 1704 and a (combined) front-side principal plane 1705 when a 3-stage collimator lens is regarded as one lens are maintained to be constant. As a result, the optical properties other than the aberration (spherical aberration) of the irradiation optical system, for example, the parallelism and the irradiation angle of an electron beam near the optical axis are maintained. As described above, it is possible to adjust the aberration (spherical aberration) of the irradiation optical system while maintaining the optical properties other than the aberration (spherical aberration) as illustrated in FIGS. 17C and 17D.

The concept of suppressing the residues of the correction of the deviation of irradiation angle due to a change in the aperture arrangement of the aperture array and the converging lens array through the adjustment of the spherical aberration of the irradiation optical system due to a multi-stage collimator lens is not limited to the configuration of the fifth exemplary embodiment. A sixth exemplary embodiment is directed to a configuration example in which a multi-stage collimator lens is applied to the configuration of the fourth exemplary embodiment.

Figure 18:
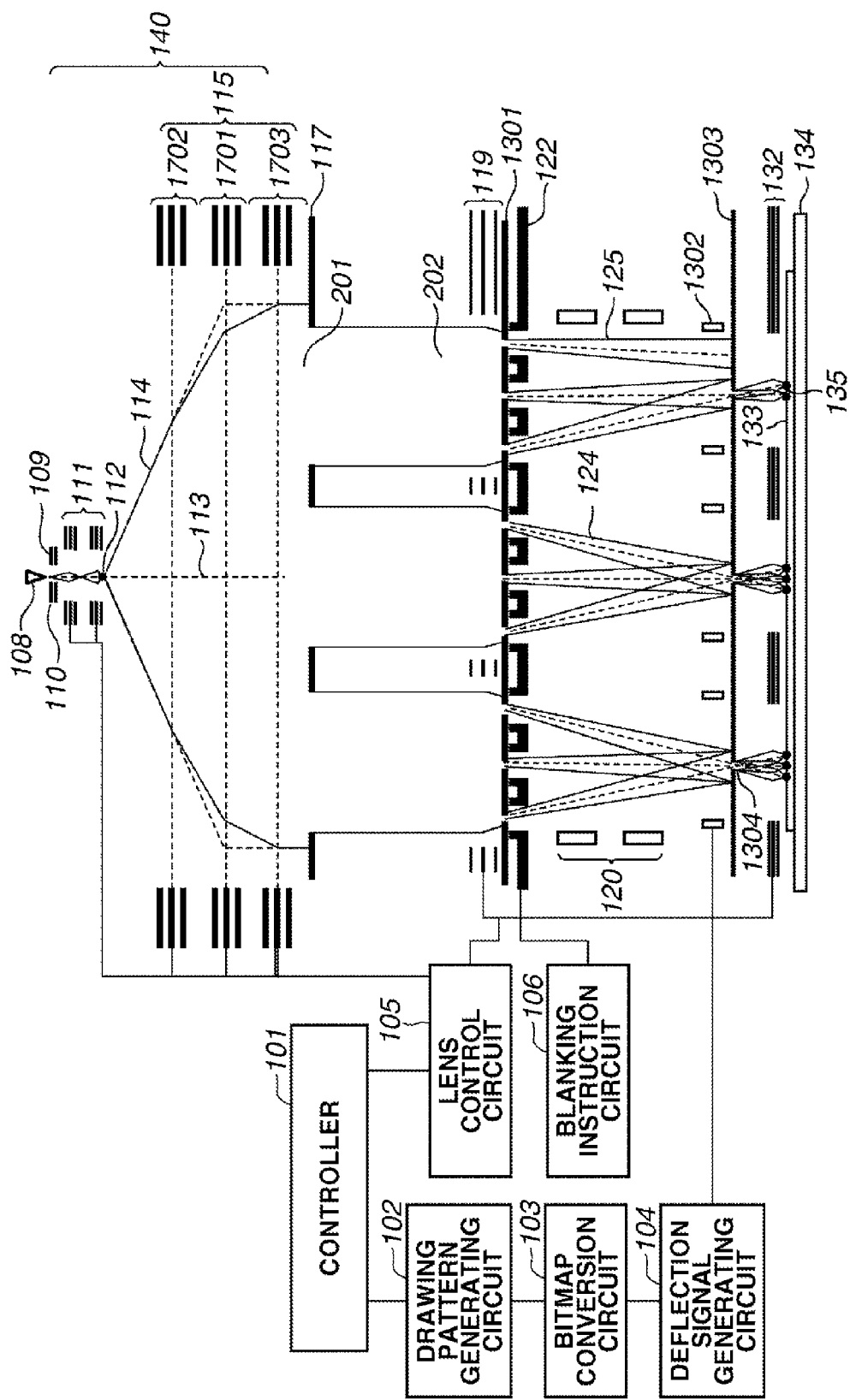
FIG. 18 is a diagram illustrating a configuration of a drawing apparatus according to a sixth exemplary embodiment.

FIG. 18 is a diagram illustrating a configuration of a drawing apparatus according to the sixth exemplary embodiment. In the present exemplary embodiment, spherical aberration of the irradiation optical system is varied by replacing the collimator lens 115 according to the fourth exemplary embodiment with the multi-stage collimator lens 115 as described in the fifth exemplary embodiment. Thus, the difference between the present exemplary embodiment and the fourth exemplary embodiment lies in the configuration of the collimator lens 115. In the present exemplary embodiment, the configuration and the function of the multi-stage collimator lens 115 are similar to those of the fifth exemplary embodiment. More specifically, by configuring the collimator lens to have multiple stages, the correction residues resulting from an estimation error of the aberration (spherical aberration) of the irradiation optical system may be suppressed (corrected) by adjusting the aberration (spherical aberration) while maintaining the optical properties other than the aberration (spherical aberration).

In the present exemplary embodiment, the estimation error of the spherical aberration of the irradiation optical system appears as the positional deviation of electron beams on the stop aperture array 1303. Thus, the amount of estimation error may be obtained by measuring the amount of positional deviation (deviation from a target position) of electron beams on the stop aperture array 1303 in relation to a plurality of different image heights, for example. More specifically, a sensor configured to detect an electron beam (incident current) may be disposed on the stage 134, for example. More specifically, electron beams are scanned on the stop aperture array using the aligner 120, and electron beams having passed through the apertures of the stop aperture array are detected by the sensor, whereby the positional deviation may be measured. Moreover, by performing this measurement on a plurality of electron beams corresponding to a plurality of different image heights, it may be examined whether the amount of positional deviation of electron beams has a correlation with the above cubic function.

In the fifth and sixth exemplary embodiments, spherical aberration of the irradiation optical system has been adjusted so that other optical properties are not changed by configuring the collimator lens to have multiple stages of lens. In a seventh exemplary embodiment, spherical aberration of the irradiation optical system is adjusted while suppressing the amount of change in other optical properties within an allowable range although the change is greater than that of the fifth and sixth exemplary embodiments. The configuration of the seventh exemplary embodiment is similar to that of the first, third, and fourth exemplary embodiments except the following respects.

The seventh exemplary embodiment is characterized in that spherical aberration of the irradiation optical system is adjusted by adjusting the focal length (or the power) of the collimator lens 115 and adjusting the positions of the crossovers 112 formed on the front side of the collimator lens 115. In the present exemplary embodiment, by adjusting the power of the collimator lens 115, the dependency on the image height of spherical aberration of the irradiation optical system may be adjusted. This may be understood from the cubic function representing $\Delta\theta$ described above. The amount of angular deviation $\Delta\theta$ of electron beams due to spherical aberration of the irradiation optical system may be approximately expressed by a cubic function, $\Delta\theta = Cs(Y/f)^3 + \Delta f(Y/f)$, as described above. Thus, by adjusting the focal length f (or the power) of the collimator lens 115, the dependency on the image height Y of $\Delta\theta$ may be adjusted.

For example, when an electron emission surface of a cathode is planar, depending on the configuration of an electron source, no crossover (true crossover) at which electrons actually converge or diverge may be provided on the front side of the collimator lens 115, but imaginary or virtual crossovers (virtual crossovers) may be formed on the front side of the collimator lens 115. In this case, electrons on the rear side of the collimator lens take such a trajectory that the electrons diverge from the virtual crossovers to be made parallel by the collimator lens. Thus, optical systems disposed closer to the rear side than the collimator lens may be configured using the virtual crossovers as virtual object points. Therefore, in systems in which no true crossover is provided on the front side of the collimator lens 115, the positions of the virtual crossovers may be employed as the positions of the crossovers 112 when performing the adjustment. In the present exemplary embodiment, it is assumed that the crossovers (irradiation system crossovers) which are formed on the front side of the collimator lens by the irradiation optical system include both the real crossovers and the virtual crossovers.

As an adjustment unit for adjusting the positions of the crossovers 112, a driving unit for moving the part (also referred to as a charged particle source) extending from a cathode electrode to the crossover adjustment optical system and an adjustment unit for adjusting the potentials of the electrodes constituting the crossover adjustment optical system may be employed. FIGS. 19A, 19B, and 19C are diagrams illustrating these two units. FIG. 19A illustrates a state before adjustment. FIG. 19B illustrates a state in which the position of a crossover is adjusted by the driving unit for moving the electron source part (a part surrounded by a dotted line in the figure). FIG. 19C illustrates a state in which the position of the crossover is adjusted by the adjustment unit for adjusting the potentials of the electrodes constituting the crossover adjustment optical system. It may be understood from FIGS. 19A, 19B, and 19C that adjustment may be performed by any one of the driving unit and the adjustment unit so that the position of the crossover matches a target position (the crossover position is located on a target crossover plane 1901). In the present exemplary embodiment, the position of the crossover 112 may be naturally adjusted by a combination of these two units.

When the configuration of the present exemplary embodiment is employed, the influence on optical systems on the subsequent stage needs to be taken into consideration. One example of the influence is a change of the magnification of the rear-side optical system due to a change of the focal length of the collimator lens. The ratio of a magnification change is expressed by f'/f, where f is a focal length before change and f' is a focal length after change. Thus, when the configuration of the present exemplary embodiment is employed, it is useful to include a unit configured to correct a magnification change of the rear-side optical system or to perform the above adjustment within a range such that the magnification change of the rear-side optical system is allowable. In the present exemplary embodiment, one example of the unit correcting the magnification change involves adjusting the diameter of a crossover using the crossover adjustment optical system, for example. However, when the adjustment by the crossover adjustment optical system is performed, since spherical aberration of the crossover adjustment optical system may also be changed, adjustment needs to be performed by taking the change of the spherical aberration into consideration. Moreover, when a configuration in which the crossover adjustment optical system is not included in the charged particle source is employed, the correction of the magnification change is not performed by the crossover adjustment optical system as a matter of course. Since the coulomb effect is great in crossovers in a high current-density area, the configuration without the crossover adjustment optical system may be employed to obviate the effect. In this case, the above adjustment may be performed within such a range that the magnification change of the rear-side optical system is allowable.

A method of manufacturing an article according to an exemplary embodiment is suitable for manufacturing microdevices such as a semiconductor device and articles such as elements having a microscopic structure, for example. The manufacturing method includes an operation or a step (a step of performing drawing on a substrate) of forming a latent image pattern on a photosensitive material applied on a substrate using the drawing apparatus and a step of developing the substrate on which the latent image pattern is formed by the above step. The manufacturing method may include other known steps (oxidation, film formation, deposition, doping, planarization, etching, resist removal, dicing, bonding, packaging, and the like). The article manufacturing method of the present exemplary embodiment is advantageous in terms of at least one of performance, quality, productivity, and production cost of articles as compared to the conventional method.

While exemplary embodiments have been described, the present invention is not limited to these exemplary embodiments but may be modified and changed in various ways within the scope of the spirit thereof. For example, the apertures of the converging lens array may be deviated rather than deviating the apertures of the aperture array so that the positions of the crossovers formed by the converging lens array match the apertures (the centers thereof) of a rear-side element such as the blanker array or the stop aperture array. However, this configuration requires attention to the fact that the principal rays of electron beams incident on the apertures of the element are not parallel to the optical axis. This configuration may be used, for example, when such an angular deviation of principal rays is allowable and when an optical element for correcting the angular deviation is additionally included.

While the embodiments have been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Applications No. 2011-068014 filed Mar. 25, 2011 and No. 2011-122742 filed May 31, 2011, which are hereby incorporated by reference herein in their entirety.

What is claimed is:

1. A drawing apparatus configured to perform drawing on a substrate with a plurality of charged particle beams, the drawing apparatus comprising:
   an irradiation optical system including a collimator lens on which a diverging charged particle beam is incident;
   an aperture array configured to split the charged particle beam from the irradiation optical system into a plurality of charged particle beams;
   a converging lens array configured to form a plurality of crossovers of the plurality of charged particle beams from the aperture array; and
   a projection optical system including an element in which a plurality of apertures corresponding to the plurality of crossovers are formed, and a plurality of projection lenses corresponding to the plurality of apertures and configured to project charged particle beams from the plurality of apertures onto the substrate,
   wherein the converging lens array includes converging lenses disposed such that each of the plurality of crossovers, which are formed by the converging lenses from the charged particle beam incident on the aperture array at incidence angles associated with aberration of the irradiation optical system, is aligned with corresponding one of the plurality of apertures in the element, and
   the converging lenses include a converging lens eccentric relative to corresponding one of the plurality of apertures in the element.

2. The drawing apparatus according to claim 1, wherein the eccentric converging lenses is eccentric so as to compensate for the aberration of the irradiation optical system.

3. The drawing apparatus according to claim 1, wherein the collimator lens has a front focal plane located at a position deviating from a position of a crossover from which a charged particle beam diverges and is incident on the collimator lens.

4. The drawing apparatus according to claim 1, wherein the aperture array includes an aperture eccentric relative to corresponding one of the plurality of apertures in the element with the eccentric converging lens.

5. The drawing apparatus according to claim 1, wherein the aperture array is disposed at a front focal plane of the converging lens array, and includes an aperture eccentric relative to corresponding one of the plurality of apertures in the element with the eccentric converging lens by the same amount as the eccentric converging lens.

6. The drawing apparatus according to claim 1, wherein the aperture array is disposed at a position deviating from a front focal plane of the converging lens array, and includes an aperture which is eccentric relative to corresponding one of the plurality of apertures in the element with the eccentric converging lens by an amount different from that by which the eccentric converging lens is eccentric.

7. The drawing apparatus according to claim 1, wherein the drawing apparatus comprises a plurality of groups arranged in parallel, each group including the irradiation optical system, the aperture array, the converging lens array, and the projection optical system.

8. The drawing apparatus according to claim 1, wherein the element includes a blanker array.

9. The drawing apparatus according to claim 1, wherein the element includes a stop aperture array.

10. A drawing apparatus configured to perform drawing on a substrate with a plurality of charged particle beams, the drawing apparatus comprising:
    an irradiation optical system including a collimator lens on which a diverging charged particle beam is incident;
    an aperture array configured to split the charged particle beam from the irradiation optical system into a plurality of charged particle beams;
    a converging lens array configured to form a plurality of crossovers of the plurality of charged particle beams from the aperture array; and
    a projection optical system including an element in which a plurality of apertures corresponding to the plurality of crossovers are formed, and a plurality of projection lenses corresponding to the plurality of apertures and configured to project charged particle beams from the plurality of apertures onto the substrate,
    wherein the converging lens array includes a converging lens eccentric relative to corresponding one of the plurality of apertures in the element,
    wherein the irradiation optical system is configured to adjust an aberration thereof such that each of the plurality of crossovers, which are formed by the converging lenses from the charged particle beam incident on the aperture array at incidence angles associated with the aberration of the irradiation optical system, is aligned with corresponding one of the plurality of apertures in the element.

11. The drawing apparatus according to claim 10, wherein the collimator lens includes a plurality of charged particle lenses, and
    wherein the irradiation optical system is configured to adjust at least one of a power and position of each of the plurality of charged particle lenses so as to change the aberration with a front focal plane position and a front principal plane position of the collimator lens kept.

12. The drawing apparatus according to claim 10, wherein the irradiation optical system is configured to form an irradiation optical system crossover at a front-side position of the collimator lens, and
    wherein the irradiation optical system is configured to adjust the aberration by adjusting a focal length of the collimator lens, and adjusts a position of the irradiation optical system crossover in accordance with the adjusted focal length.

13. The drawing apparatus according to claim 12, wherein the irradiation optical system includes a charged particle source, and
    wherein the irradiation optical system is configured to adjust the position of the irradiation optical system crossover by displacement of the charged particle source.

14. The drawing apparatus according to claim 12, wherein the irradiation optical system includes a crossover adjustment optical system arranged at a front side of the irradiation optical system crossover, and wherein the irradiation optical system is configured to adjust the positions of the irradiation optical system crossover by adjustment of a power of the crossover adjustment optical system.

15. The drawing apparatus according to claim 10, wherein the eccentric converging lens is eccentric so as to compensate for the aberration of the irradiation optical system.

16. The drawing apparatus according to claim 10, wherein the collimator lens has a front focal plane located at a position deviating from a position of a crossover from which a charged particle beam diverges and is incident on the collimator lens.

17. The drawing apparatus according to claim 10, wherein the aperture array includes an aperture eccentric relative to corresponding one of the plurality of apertures in the element with the eccentric converging lens.

18. The drawing apparatus according to claim 10, wherein the aperture array is disposed at a front focal plane of the converging lens array, and includes an aperture eccentric relative to corresponding one of the plurality of apertures in the element with the eccentric converging lens by the same amount as the eccentric converging lens.

19. The drawing apparatus according to claim 10, wherein the aperture array is disposed at a position deviating from a front focal plane of the converging lens array, and includes an aperture which is eccentric relative to corresponding one of the plurality of apertures in the element with the eccentric converging lens by an amount different from that by which the eccentric converging lens is eccentric.

20. The drawing apparatus according to claim 10, wherein the drawing apparatus includes a plurality of groups arranged in parallel, each group including the irradiation optical system, the aperture array, the converging lens array, and the projection optical system.

21. The drawing apparatus according to claim 10, wherein the element includes a blanker array.

22. The drawing apparatus according to claim 10, wherein the element includes a stop aperture array.

23. A method of manufacturing an article, the method comprising:
performing drawing on a substrate using a drawing apparatus;
developing the substrate on which the drawing has been performed; and
processing the developed substrate to manufacture the article,
wherein the drawing apparatus is configured to perform drawing on the substrate with a plurality of charged particle beams, the drawing apparatus including:
an irradiation optical system including a collimator lens on which a diverging charged particle beam is incident;
an aperture array configured to split the charged particle beam from the irradiation optical system into a plurality of charged particle beams;
a converging lens array configured to form a plurality of crossovers of the plurality of charged particle beams from the aperture array; and
a projection optical system including an element in which a plurality of apertures corresponding to the plurality of crossovers are formed, and a plurality of projection lenses corresponding to the plurality of apertures and configured to project charged particle beams from the plurality of apertures onto the substrate,
wherein the converging lens array includes converging lenses disposed such that each of the plurality of crossovers, which are formed by the converging lenses from the charged particle beam incident on the aperture array at incidence angles associated with aberration of the irradiation optical system, is aligned with corresponding one of the plurality of apertures in the element, and
the converging lenses includes a converging lens eccentric relative to corresponding one of the plurality of apertures in the element.

24. A method of manufacturing an article, the method comprising:
performing drawing on a substrate using a drawing apparatus;
developing the substrate on which the drawing has been performed; and
processing the developed substrate to manufacture the article,
wherein the drawing apparatus is configured to perform drawing on the substrate with a plurality of charged particle beams, the drawing apparatus including:
an irradiation optical system including a collimator lens on which a diverging charged particle beam is incident;
an aperture array configured to split the charged particle beam from the irradiation optical system into a plurality of charged particle beams;
a converging lens array configured to form a plurality of crossovers of the plurality of charged particle beams from the aperture array; and
a projection optical system including an element in which a plurality of apertures corresponding to the plurality of crossovers are formed, and a plurality of projection lenses corresponding to the plurality of apertures and configured to project charged particle beams from the plurality of apertures onto the substrate,
wherein the converging lens array includes a converging lens eccentric relative to corresponding one of the plurality of apertures in the element,
wherein the irradiation optical system is configured to adjust an aberration thereof such that each of the plurality of crossovers, which are formed by the converging lenses from the charged particle beam incident on the aperture array at incidence angles associated with the aberration of the irradiation optical system, is aligned with corresponding one of the plurality of apertures in the element.

* * * * *